United States Patent
Funaki

(10) Patent No.: US 9,641,783 B2
(45) Date of Patent: May 2, 2017

(54) SOLID-STATE IMAGE PICKUP DEVICE THAT PERFORMS OPTOELECTRONIC CONVERSION BY ACCUMULATING AN OPTICAL SIGNAL

(71) Applicant: JVC KENWOOD Corporation, Yokohama-shi, Kanagawa (JP)

(72) Inventor: Masaki Funaki, Yokohama (JP)

(73) Assignee: JVC KENWOOD CORPORATION, Yokohama-Shi, Kanagawa (JP)

(*) Notice: Subject to any disclaimer, the term of this patent is extended or adjusted under 35 U.S.C. 154(b) by 0 days.

(21) Appl. No.: 14/861,408

(22) Filed: Sep. 22, 2015

(65) Prior Publication Data

US 2016/0088249 A1  Mar. 24, 2016

(30) Foreign Application Priority Data

Sep. 24, 2014 (JP) ................................ 2014-193265

(51) Int. Cl.
| | | |
|---|---|---|
| H04N 5/378 | (2011.01) | |
| H04N 5/355 | (2011.01) | |
| H04N 5/3745 | (2011.01) | |
| H01L 27/146 | (2006.01) | |

(52) U.S. Cl.
CPC ......... *H04N 5/378* (2013.01); *H01L 27/1464* (2013.01); *H01L 27/14607* (2013.01); *H01L 27/14612* (2013.01); *H01L 27/14634* (2013.01); *H01L 27/14636* (2013.01); *H04N 5/35554* (2013.01); *H04N 5/3745* (2013.01)

(58) Field of Classification Search
CPC ......... H01L 27/14607; H01L 27/14612; H01L 27/14634; H04N 5/35554; H04N 5/3745
See application file for complete search history.

(56) References Cited

U.S. PATENT DOCUMENTS

| | | | | |
|---|---|---|---|---|
| 2004/0027469 A1* | 2/2004 | Tsuruoka | ............. | H04N 5/3651 348/241 |
| 2004/0212703 A1* | 10/2004 | Sugimoto | .............. | H04N 5/335 348/241 |
| 2006/0017837 A1* | 1/2006 | Sorek | ................... | H04N 5/2355 348/362 |
| 2008/0218599 A1* | 9/2008 | Klijn | ...................... | H04N 5/235 348/229.1 |

(Continued)

FOREIGN PATENT DOCUMENTS

JP        2012-248952 A       12/2012

*Primary Examiner* — Amy Hsu
(74) *Attorney, Agent, or Firm* — Procopio, Cory, Hargreaves & Savitch LLP

(57) ABSTRACT

A solid-state image pickup device includes an optoelectronic conversion unit, a first optical signal accumulation unit, a second optical signal accumulation unit, and a combining unit, in which the first optical signal accumulation unit accumulates a first optical signal obtained by the optoelectronic conversion by the optoelectronic conversion unit in a first period, the second optical signal accumulation unit accumulates a second optical signal obtained by the optoelectronic conversion by the optoelectronic conversion unit in a second period, the second period being shorter than the first period, and the combining unit combines the second optical signal with the first optical signal when a noise in the first optical signal is equal to or larger than a noise in the second optical signal.

7 Claims, 13 Drawing Sheets

(56) References Cited

U.S. PATENT DOCUMENTS

| | | | |
|---|---|---|---|
| 2008/0219585 A1* | 9/2008 | Kasai | H04N 5/2351 382/274 |
| 2009/0046947 A1* | 2/2009 | Kobayashi | G06T 5/50 382/284 |
| 2009/0109306 A1* | 4/2009 | Shan | H04N 5/235 348/273 |
| 2009/0207258 A1* | 8/2009 | Jang | H04N 5/2355 348/208.1 |
| 2012/0050557 A1* | 3/2012 | Atanassov | H04N 5/35581 348/222.1 |
| 2015/0348242 A1* | 12/2015 | Molgaard | G06T 5/50 348/241 |
| 2016/0050381 A1* | 2/2016 | Onishi | H04N 5/355 348/300 |

\* cited by examiner

SOLID-STATE IMAGE PICKUP DEVICE THAT PERFORMS OPTOELECTRONIC CONVERSION BY ACCUMULATING AN OPTICAL SIGNAL

CROSS REFERENCE TO RELATED APPLICATION

This application is based upon and claims the benefit of priority from Japanese patent application No. 2014-193265, filed on Sep. 24, 2014, the disclosure of which is incorporated herein in its entirety by reference.

BACKGROUND OF THE INVENTION

1. Field of the Invention

The present invention relates to a solid-state image pickup device.

2. Description of Related Art

A back-side illuminated solid-state image pickup device that performs a global shutter operation has been proposed. For this technique, Japanese Unexamined Patent Application Publication No. 2012-248952 discloses a solid-state image pickup device in which a first substrate is electrically connected to a second substrate. In Japanese Unexamined Patent Application Publication No. 2012-248952, photodiodes are disposed on the first substrate and a memory composed of capacitors is provided on the second substrate. Further, a global shutter operation is carried out by recording optical signals in the capacitors disposed on the second substrate.

Note that for increasing the dynamic range in a CMOS (Complementary Metal-Oxide-Semiconductor) image sensor, there is a method in which an optical signal obtained by a short-time exposure is combined with an optical signal obtained by a long-time exposure. When this method is implemented in a back-side illuminated solid-state image pickup device with capacitors disposed therein, it is necessary to provide the solid-state image pickup device with capacitors that are used to separately accumulate optical signals obtained by long-time exposures and those obtained by short-time exposures. Therefore, it is necessary to increase the number of capacitors.

SUMMARY OF THE INVENTION

However, because of the restriction on the area (i.e., size) of the substrate, the area for one capacitor needs to be reduced when the number of capacitors is increased. As a result, the capacitance of the capacitor is reduced. Further, assuming that the leak current is unchanged, the smaller the capacitances of the capacitors are, the more the image quality deteriorates. Therefore, when the method in which the number of capacitors is simply increased is used, the image quality deteriorates.

A first exemplary aspect is a solid-state image pickup device including: an optoelectronic conversion unit that performs an optoelectronic conversion; a first optical signal accumulation unit that accumulates an optical signal obtained by the optoelectronic conversion by the optoelectronic conversion unit; a second optical signal accumulation unit that accumulates an optical signal obtained by the optoelectronic conversion by the optoelectronic conversion unit; and a combining unit that combines the optical signal accumulated in the second optical signal accumulation unit with the optical signal accumulated in the first optical signal accumulation unit, in which the first optical signal accumulation unit accumulates a first optical signal obtained by the optoelectronic conversion by the optoelectronic conversion unit in a first period, the second optical signal accumulation unit accumulates a second optical signal obtained by the optoelectronic conversion by the optoelectronic conversion unit in a second period, the second period being shorter than the first period, and the combining unit combines the second optical signal with the first optical signal when a noise in the first optical signal is equal to or larger than a noise in the second optical signal.

The above and other objects, features and advantages of the present invention will become more fully understood from the detailed description given hereinbelow and the accompanying drawings which are given by way of illustration only, and thus are not to be considered as limiting the present invention.

BRIEF DESCRIPTION OF THE DRAWINGS

The above and other aspects, advantages and features will be more apparent from the following description of certain embodiments taken in conjunction with the accompanying drawings, in which.

DESCRIPTION OF THE EXEMPLARY EMBODIMENTS

First Exemplary Embodiment

Exemplary embodiments according to the present invention are explained hereinafter with reference to the drawings.

Figure 1:
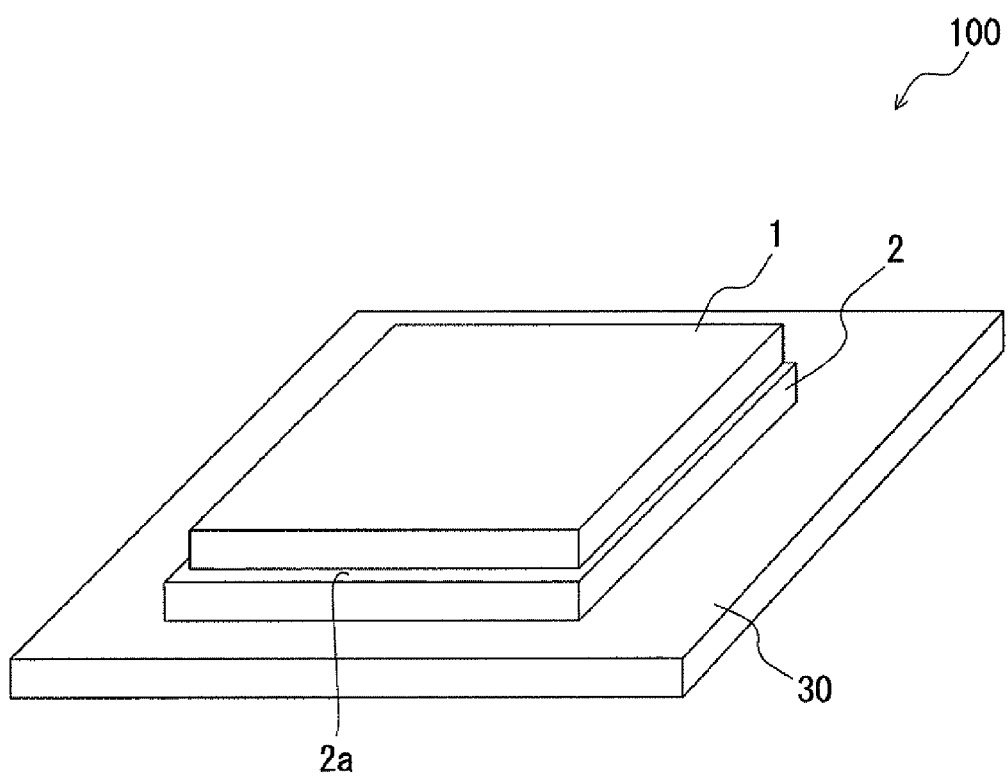
FIG. 1 is an overall view of a solid-state image pickup device according to a first exemplary embodiment.

FIG. 1 is an overall view of a solid-state image pickup device 100 according to a first exemplary embodiment. The solid-state image pickup device 100 includes a substrate 1, which is a first substrate, a substrate 2, which is a second substrate, and a substrate 30, which is a third substrate. The substrate 1 has a region in which pixels each of which has a circuit for converting light into an optical signal are arranged. The substrate 2 includes a circuit that receives optical signals from the substrate 1 and processes the received optical signals. The substrate 30 is a radiator plate and has a function of externally releasing heat generated in the substrates 1 and 2 from the rear surface of the substrate 2. That is, heat generated in the substrate 1 is externally released through the substrate 2. Note that the substrate 30 may be provided with, for example, a temperature control unit that actively releases heat by using a Peltier device or the like. Further, the front surface of the substrate 1 is opposed to the front surface of the substrate 2. Further, the substrate 30 is disposed on the rear surface side of the substrate 2.

Further, the thickness of the silicon layer of the substrate 1 is, for example, about 10 µm. Further, the thickness of the silicon layer of the substrate 2 is, for example, about 200 to 1,000 µm. Further, the thickness of the substrate 30 is, for example, about 1,000 to 3,000 µm. Note that the material for the substrate 30 may be a metal, a ceramic having a high conductivity, a plastic, a carbon material such as diamond, sapphire, or the like. Further, the substrate 30 may be one of various types of semiconductor substrates or a multi-layered circuit board. Further, the substrate 30 does not necessarily have to be a separate substrate and may instead be a part of a package.

Regarding the size relation among the substrates, the area (i.e., size) of the substrate 2 is larger than that of the substrate 1 and the area (i.e., size) of the substrate 30 is larger than that of the substrate 2 in the example shown in FIG. 1. Pads 2a are provided in the part of the substrate 2 that extends beyond the substrate 1, and signals are exchanged between the substrate 2 and external circuits through these pads 2a. It should be noted that the size relation of the substrates is not limited to the above-described relation. For example, the substrates may have the same size as each other. Further, a through-tunnel(s), for example, may be formed between the front and rear surfaces of the substrate 2 and a micro-bump(s) may be formed in the through-tunnel(s). In this case, the substrate 1 may be connected to the substrate 30 by using the micro-bump(s), so that signals or electric power may be exchanged between the substrate 1 and external circuits through the substrate 30.

Figure 2:
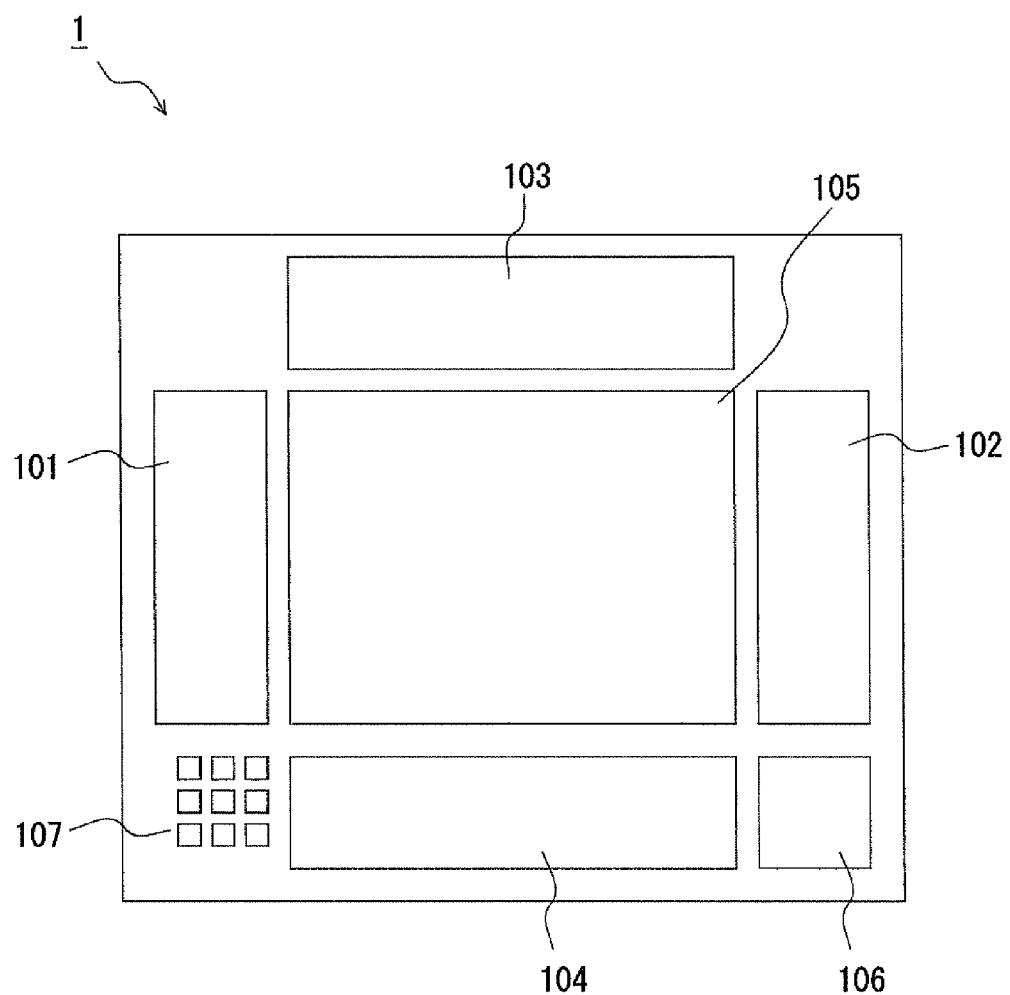
FIG. 2 shows an overall configuration of a first substrate of the solid-state image pickup device according to the first exemplary embodiment.

FIG. 2 shows an overall configuration of the substrate 1, which is the first substrate of the solid-state image pickup device 100 according to the first exemplary embodiment. The substrate 1 includes a pixel-arranged region 105, peripheral circuits 101, 102, 103, 104 and 106, and pads 107. In the pixel-arranged region 105, parts of pixel circuits including photo-diodes are arranged in an orderly manner. Peripheral circuits 101, 102, 103 and 104 include drive circuits for driving pixels and the like. By these drive circuits, each pixel disposed in the pixel-arranged region 105 performs a predetermined operation. The peripheral circuit 106 includes a control circuit that controls the above-described driving circuits so that they operate properly. Specifically, the control circuit performs control as to which pixels should be driven at which timings. Further, the peripheral circuit 106 is provided with a power supply circuit that stably supplies electric power. The pads 107 connect the substrate 1 with the substrate 2 and are used to exchange signals between the substrates 1 and 2. Further, electric power is also exchanged through the pads 107.

Figure 3:
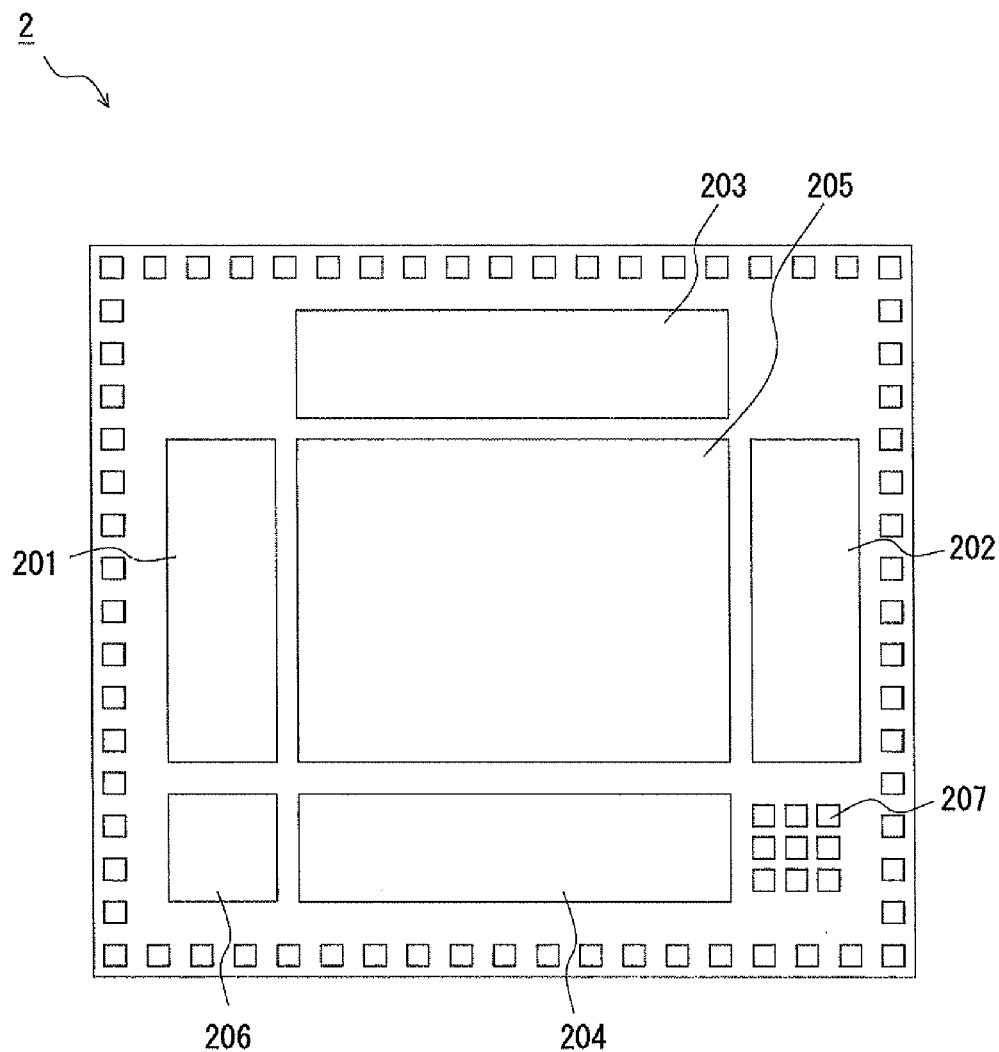
FIG. 3 shows an overall configuration of a second substrate of the solid-state image pickup device according to the first exemplary embodiment.

FIG. 3 shows an overall configuration of the substrate 2, which is the second substrate of the solid-state image pickup device 100 according to the first exemplary embodiment. The substrate 2 includes a pixel-arranged region 205, peripheral circuits 201, 202, 203, 204 and 206, and pads 207. In the pixel-arranged region 205, another set of pixel circuits corresponding to those in the pixel-arranged region 105 are arranged in an orderly manner. The pixel circuits disposed in the pixel-arranged region 205 are configured to receive optical signals from the pixel circuits disposed in the pixel-arranged region 105 and hold the received optical signals. That is, a pixel circuit disposed in the substrate 1 and a corresponding pixel circuit disposed in the substrate 2 form one pixel circuit.

The peripheral circuits 201, 202, 203, 204 and 206 include a digital-analog conversion circuit, an analog-digital conversion circuit, an image processing circuit that performs image processing, a power supply circuit, a timing adjustment circuit, a clock signal supply circuit, and so on. The analog-digital conversion circuit is a circuit that performs an analog-digital conversion for an optical signal or a reference potential on a row-by-row basis or a column-by-column basis. The digital-analog conversion circuit includes a digital-analog converter that generates an intermediate potential signal for each circuit and generates a high-performance ramp waveform necessary for an analog-digital conversion. The image processing circuit is a circuit that receives a signal from each pixel and thereby forms an image. For example, the image processing circuit includes a white-spot correction function, a gray-scale setting function, a white-balance setting function, a field memory, a still image/moving image compression circuit, and a circuit for performing serial communication with an external entity. The pads 207 connect the substrate 1 with the substrate 2 and are used to exchange signals between the substrates 1 and 2.

Note that FIGS. 2 and 3 show the substrates 1 and 2, respectively, as viewed from their front sides. The substrates 1 and 2 are arranged so that their front sides are opposed to each other. In other words, the substrates 1 and 2 are configured in such a manner that one of the substrates 1 and 2 shown in FIGS. 2 and 3 is flipped over in the horizontal direction and connected to the other of the substrates 1 and 2. Therefore, the pads 107 and the pads 207 are disposed so that they are opposed to each other, and they are connected to each other through micro-bumps. Note that pads and micro-bumps are also provided between the pixel-arranged regions 105 and 205 and they connect the pixel-arranged regions 105 and 205 to each other.

Figure 4:
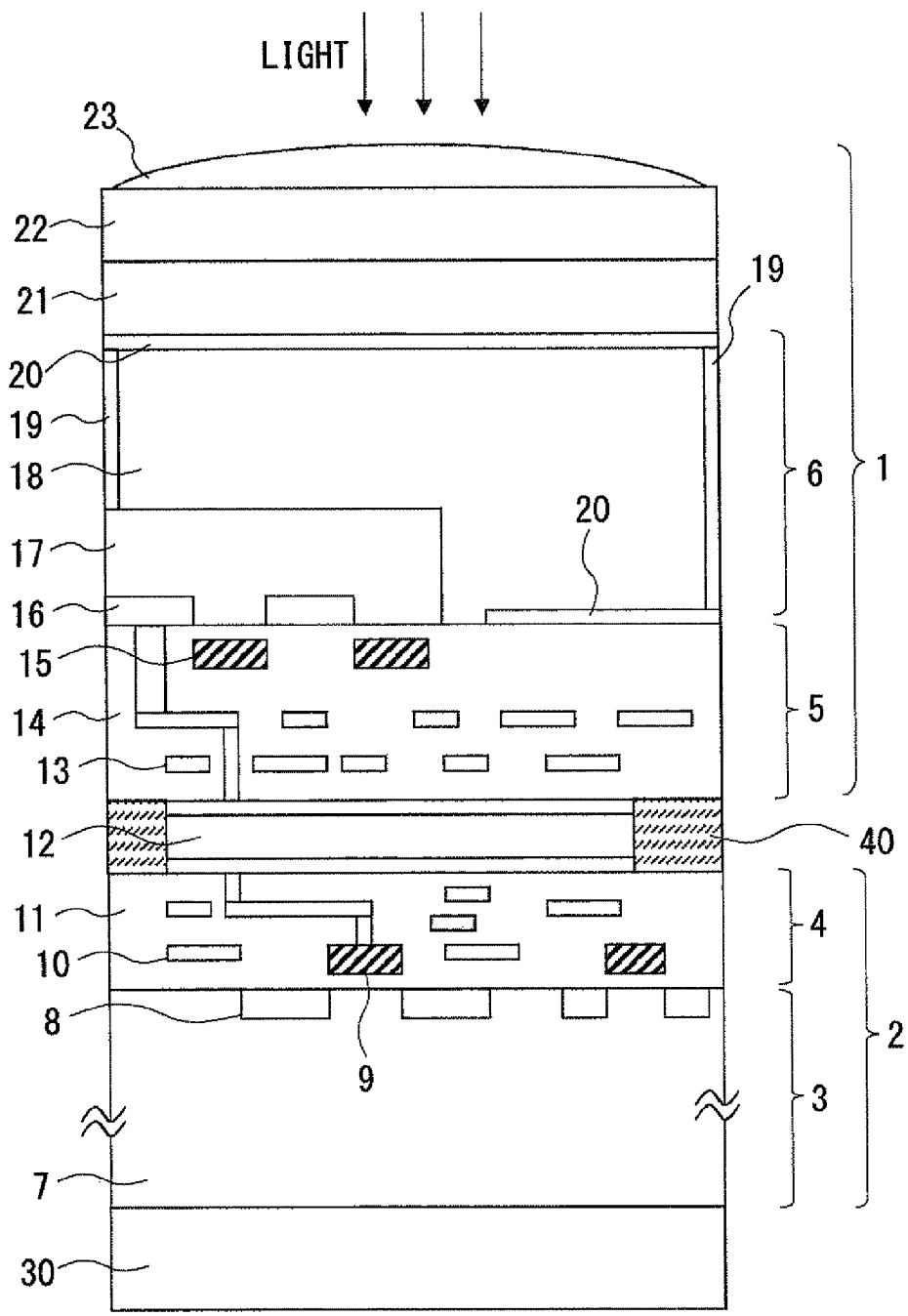
FIG. 4 shows a schematic cross section of the solid-state image pickup device in a state where a first substrate is connected to a second substrate.

FIG. 4 shows a schematic cross section of the solid-state image pickup device in a state where the substrate 1, which is the first substrate, is connected to the substrate 2, which is the second substrate. As described above, the substrates 1 and 2 are arranged so that their front sides are opposed to each other. That is, the upper side in the cross section shown in FIG. 4 is the rear side of the substrate 1 and the lower side in the cross section is the rear side of the substrate 2. The substrate 1 is configured so that, from the front side, a wiring region 5, a silicon region 6, an insulating film 21 such as a silicon oxide film, a color filter 22, and a micro-lens 23 are stacked on top of one another. Further, the substrate 2 is configured so that, from the front side, a wiring region 4 and a silicon region 3 are stacked on top of one another.

Firstly, a configuration of the substrate 1 is explained. Light enters from the rear side of the substrate 1. The light passes through the micro-lens 23. The color filter 22 lets only light having a specific wavelength(s) pass therethrough. Then, the light, which has passed through the color filter 22, passes through the insulating film 21 and is incident on an optoelectronic conversion region 18. Note that the optoelectronic conversion region 18 is an n-type semiconductor. A first p+-type region 20 prevents the occurrence of carriers of non-optical signals, which would otherwise occur in the interface between the optoelectronic conversion region 18 and an insulating film 14 and between the optoelectronic conversion region 18 and the insulating film 21, and is also used as a region where the optoelectronic conversion region 18 is configured as an embedded photo-diode. A second p+-type region 19 is a region for isolating the optoelectronic conversion region of the pixel from that of an adjacent pixel. A p-well region 17 is a region where an n-MOSFET (Metal-Oxide-Semiconductor Field-Effect Transistor) used for the pixel is formed. The MOSFET in the pixel is composed of the p-well region 17, an n+-type region 16 that becomes a source and a drain, and a gate electrode 15. An optical signal electric charge (i.e., an electric charge generated by an optical signal) is converted into a voltage by this MOSFET. Further, an optical signal having this voltage (i.e., an electric signal having the voltage representing the optical signal) passes through the inside of the wiring region 5, which is composed of the insulating film 14 and a metal line 13, reaches a connection section 12, and is transferred to the substrate 2. The optical signal having the voltage (i.e., the electric signal having the voltage representing the optical signal), which has been transferred to the substrate 2, passes through the inside of the wiring area 4, which is composed of an insulating film 11 and a metal line 10, and is transferred to a MOSFET disposed in the substrate 2. The MOSFET of the substrate 2 is composed of a p-type substrate 7 including a p-well region, source/drain regions 8, and a gate electrode 9. Further, a MOS capacitor is formed by using a gate electrode and the like. In this way, a second pixel circuit disposed in the substrate 2 is formed.

Note that although only an n-MOSFET is included in the pixel disposed in the substrates 1 and 2 in the example shown in FIG. 4, only a μ-MOSFET may be included in the pixel in other examples. In such cases, the conductive types of the optoelectronic conversion region 18, the p-well region 17, the n+-type region 16, the p-type substrate 7, and the source/drain regions 8 are all reversed. Further, a C-MOS circuit may be formed by forming a p-well region and an n-well region in the pixel. Note that although only the pixel section is shown in FIG. 4, a CMOS circuit may also be used for the peripheral circuits 101-104 and 106 disposed around the pixel-arranged region 105, as shown in FIG. 2.

Figure 5:
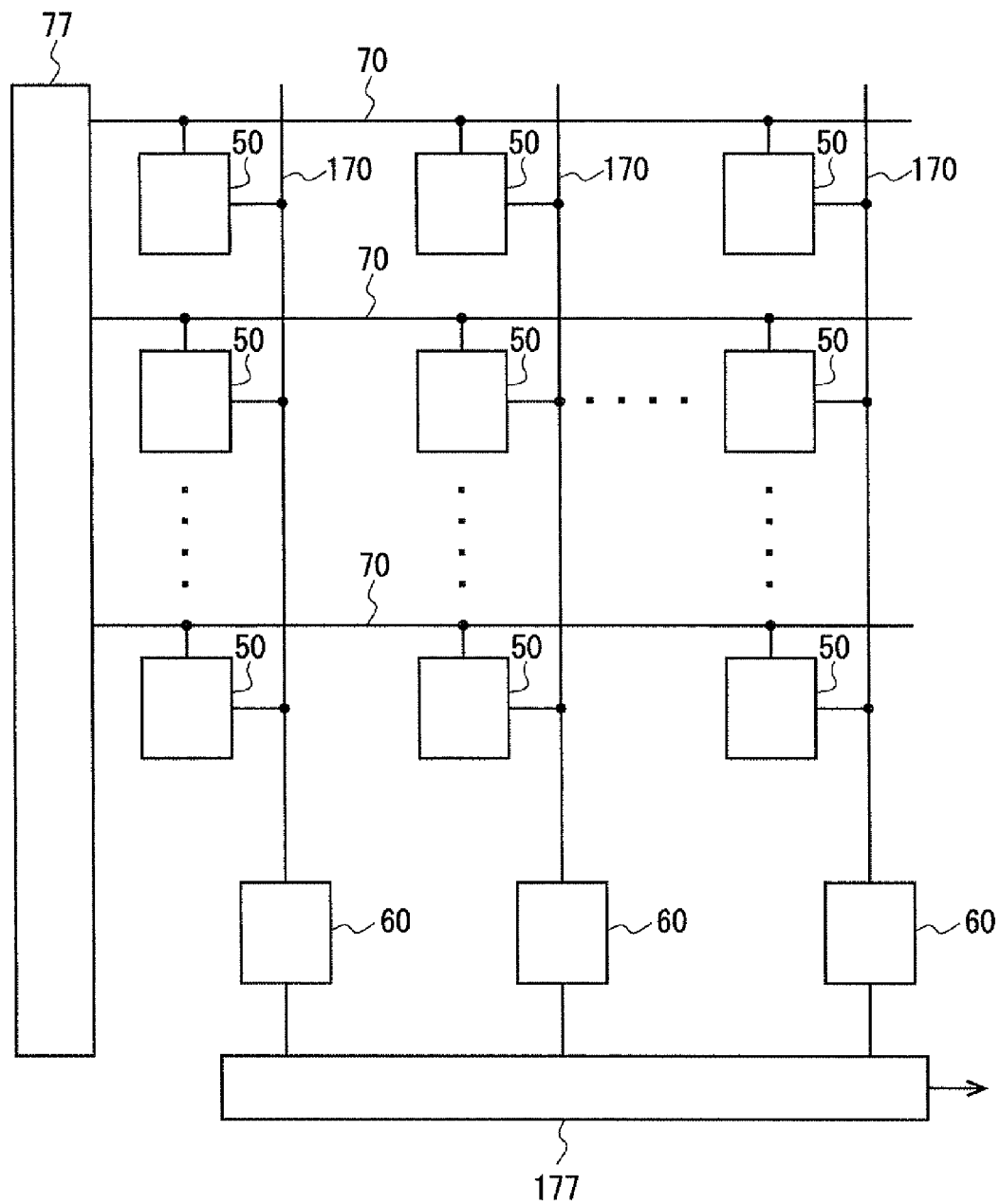
FIG. 5 shows a pixel configuration of the solid-state image pickup device according to the first exemplary embodiment.

FIG. 5 shows a pixel configuration of the solid-state image pickup device 100 according to the first exemplary embodiment. A plurality of pixel units 50 are provided in the pixel-arranged areas 105 and 205. As shown in FIG. 5, the plurality of pixel units 50 are arranged in a matrix pattern. Note that FIG. 5 schematically shows a state in which those pixel units 50 are arranged in a matrix pattern. In reality, as described above with reference to FIG. 4, those pixel units 50 do not necessarily have to be arranged with spatial intervals therebetween.

Each pixel unit 50 is connected to a vertical scan circuit 77 through a row signal line 70 and also connected to a column processing circuit 60 through a column signal line 170. Further, each column processing circuit 60 is connected to a horizontal scan circuit 177. A vertical scan circuit 77 is provided in each of the peripheral circuits 101 and 102 and each of peripheral circuits 201 and 202. Further, column processing circuits 60 and a horizontal scan circuit 177 are provided in each of the peripheral circuits 103 and 104 and each of the peripheral circuits 203 and 204.

The vertical scan circuit 77 is composed of, for example, a shift-register and controls the driving of the pixel units 50 on a row-by-row basis. This driving control includes an initialization operation (reset operation), an accumulation operation, a signal reading operation, and the like of the pixel units 50. To perform this driving control, the vertical scan circuit 77 outputs a control signal (control pulse) to each pixel unit 50 through the row signal line 70, one of which is provided for each row, and thereby independently controls the pixel units 50 on a row-by-row basis. As the vertical scan circuit 77 performs the driving control, a pixel signal is output from the pixel unit 50 to the column signal line 170, one of which is provided for each column.

The column processing circuit 60 processes a signal that is output from the pixel unit 50 to the column signal line 170. The column processing circuit 60 functions as a combining unit that combines a plurality of optical signals obtained by exposures performed at a plurality of different timings. Details of this function are described later. The horizontal scan circuit 177 is composed of, for example, a shift-register. The horizontal scan circuit 177 reads pixel signals by selecting a pixel column from which a pixel signal should be read one after another, selecting a column processing circuit 60 associated with the selected pixel column one after another, and outputting the signal output from the column processing circuit 60 to the subsequent circuit one after another.

Figure 6:
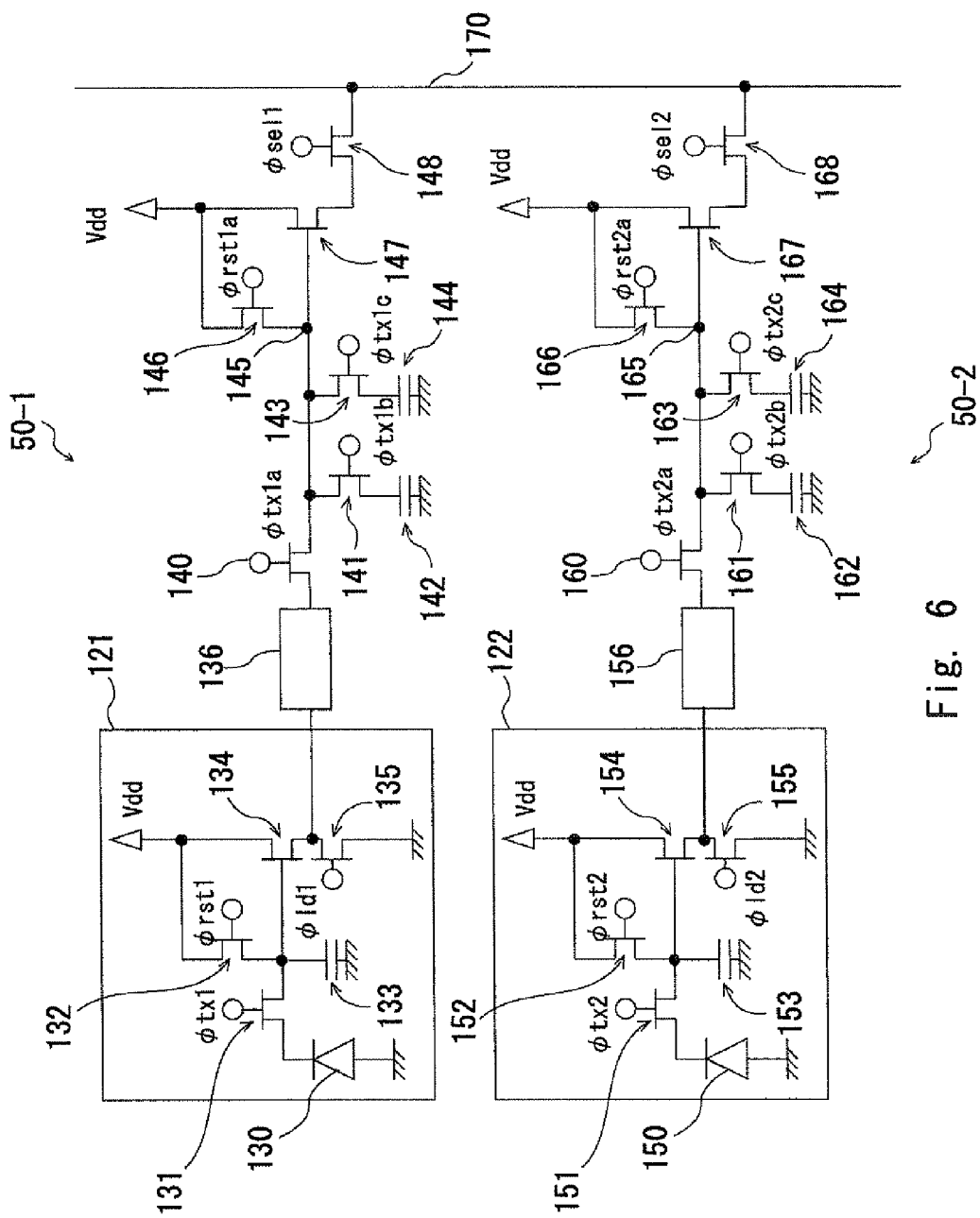
FIG. 6 shows details of a circuit configuration of each pixel of the solid-state image pickup device according to the first exemplary embodiment.

FIG. 6 shows details of a circuit configuration of each pixel of the solid-state image pickup device 100 according to the first exemplary embodiment. In FIG. 6, two pixel units 50-1 and 50-2, which are connected to the same column signal line 170, are shown. Each of connection sections 136 and 156 corresponds to the connection section 12 shown in FIG. 4 and connects the substrate 1 to the substrate 2. The sections located on the left side of the connection sections 136 and 156 are formed in the substrate 1 and the sections located on the right side of the connection sections 136 and 156 are formed in the substrate 2. On the substrate 1 side, optoelectronic conversion circuits 121 and 122 that convert light into electric signals are formed. On the substrate 2 side, signal holding circuits that hold electric signals until appropriate timings (i.e., until appropriate time points) and output circuits that output the held signals to the column signal line 170 are formed as main components thereof. Details of these components are described later.

Firstly, the optoelectronic conversion circuits 121 and 122 are explained. The optoelectronic conversion circuits 121 and 122 include photo-diodes 130 and 150, respectively. Each of the photo-diodes 130 and 150 functions as an optoelectronic conversion part that performs an optoelectronic conversion and hence converts incident light into an electric charge, i.e., into hole/electron pairs. Of the hole/electron pairs, either the holes or the electrons are accumulated in the photo-diodes 130 and 150. In this exemplary embodiment, electrons are accumulated in the photo-diodes 130 and 150. Further, a transfer transistor 131 is connected between the photo-diode 130 and a floating diffusion 133, and a transfer transistor 151 is connected between the photo-diode 150 and a floating diffusion 153. The transfer transistors 131 and 151 are controlled by signals φtx1 and φtx2, respectively, output from the vertical scan circuit 77. When the transfer transistors 131 and 151 are turned on by the signals φtx1 and φtx2, respectively, electrons accumulated in the photo-diodes 130 and 150 are transferred to the floating diffusions 133 and 153, respectively.

Further, each of the floating diffusions 133 and 153 has a function as a second optical signal accumulation part. Each of the floating diffusions 133 and 153 is a microscopic capacitance formed by a diffusion layer and a stray capacitance. Potentials of the floating diffusions 133 and 153 are lowered by electrons transferred to the floating diffusions 133 and 153, and electric charges are converted into electric signals in the floating diffusions 133 and 153.

A reset transistor 132 is connected between the floating diffusion 133 and a power supply voltage Vdd, and a reset transistor 152 is connected between the floating diffusion 153 and the power supply voltage Vdd. The reset transistors 132 and 152 are transistors for resetting (i.e., initializing) the floating diffusions 133 and 153, respectively, and are controlled by signals ϕrst1 and ϕrst2, respectively, output from the vertical scan circuit 77. Further, amplifier transistors 134 and 154 are connected to the floating diffusions 133 and 153, respectively. The amplifier transistors 134 and 154 amplify the potentials of the floating diffusions 133 and 153, respectively. Further, load transistors 135 and 155, which function as current sources, are connected to the ground-connection sides of the amplifier transistors 134 and 154, respectively. By applying a predetermined voltage to the gate electrodes of the load transistors 135 and 155, the load transistors 135 and 155 function as loads. This predetermined voltage may be, for example, a voltage of about 1.2 V, which is higher than a voltage threshold (which is described later). This voltage value may be adjustable, thus making it possible to change the current value. The voltages occurring in these loads are transferred to the substrate 2 side through the connection sections 136 and 156, respectively.

In the circuits on the substrate 2 side, switch transistors 140 and 160, which function as switches for turning on/off the electrical connections with the substrate 1, are provided between the connection sections 136 and 156 and nodes 145 and 165, respectively. The switch transistors 140 and 160 are controlled by signals ϕtx1a and ϕtx2a, respectively, output from the vertical scan circuit 77. Further, capacitors 142 and 144 are connected to the switch transistor 140 through switch transistors 141 and 143, respectively. In other words, the switch transistors 141 and 143 are connected between the node 145 and the capacitors 142 and 144, respectively. Further, capacitors 162 and 164 are connected to the switch transistor 160 through switch transistors 161 and 163, respectively. In other words, the switch transistors 161 and 163 are connected between the node 165 and the capacitors 162 and 164, respectively. The switch transistors 141, 143, 161 and 163 are controlled by signals ϕtx1b, ϕtx1c, ϕtx2b and ϕtx2c, respectively, output from the vertical scan circuit 77. Note that the pair of the capacitors 142 and 144 and the pair of the capacitors 162 and 164 each has a function as a first optical signal accumulation part.

A reset transistor 146 is connected between the node 145 and the power supply voltage Vdd, and a reset transistor 166 is connected between the node 165 and the power supply voltage Vdd. The reset transistors 146 and 166 are transistors for resetting (i.e., initializing) the nodes 145 and 165, respectively, and are controlled by signals ϕrst1a and ϕrst2a, respectively, output from the vertical scan circuit 77. Further, the nodes 145 and 165 are connected to the gates of amplifiers 147 and 167, respectively. The outputs of the amplifiers 147 and 167 are connected to the column signal line 170 through selection transistors 148 and 168, respectively. The selection transistors 148 and 168 are controlled by signals ϕsel1 and ϕsel2, respectively, output from the vertical scan circuit 77. By successively switching the selection transistors 148 and 168, pixel signals accumulated in the pixel units 50-1 and 50-2 are successively read to the column processing circuit 60.

Figure 7:
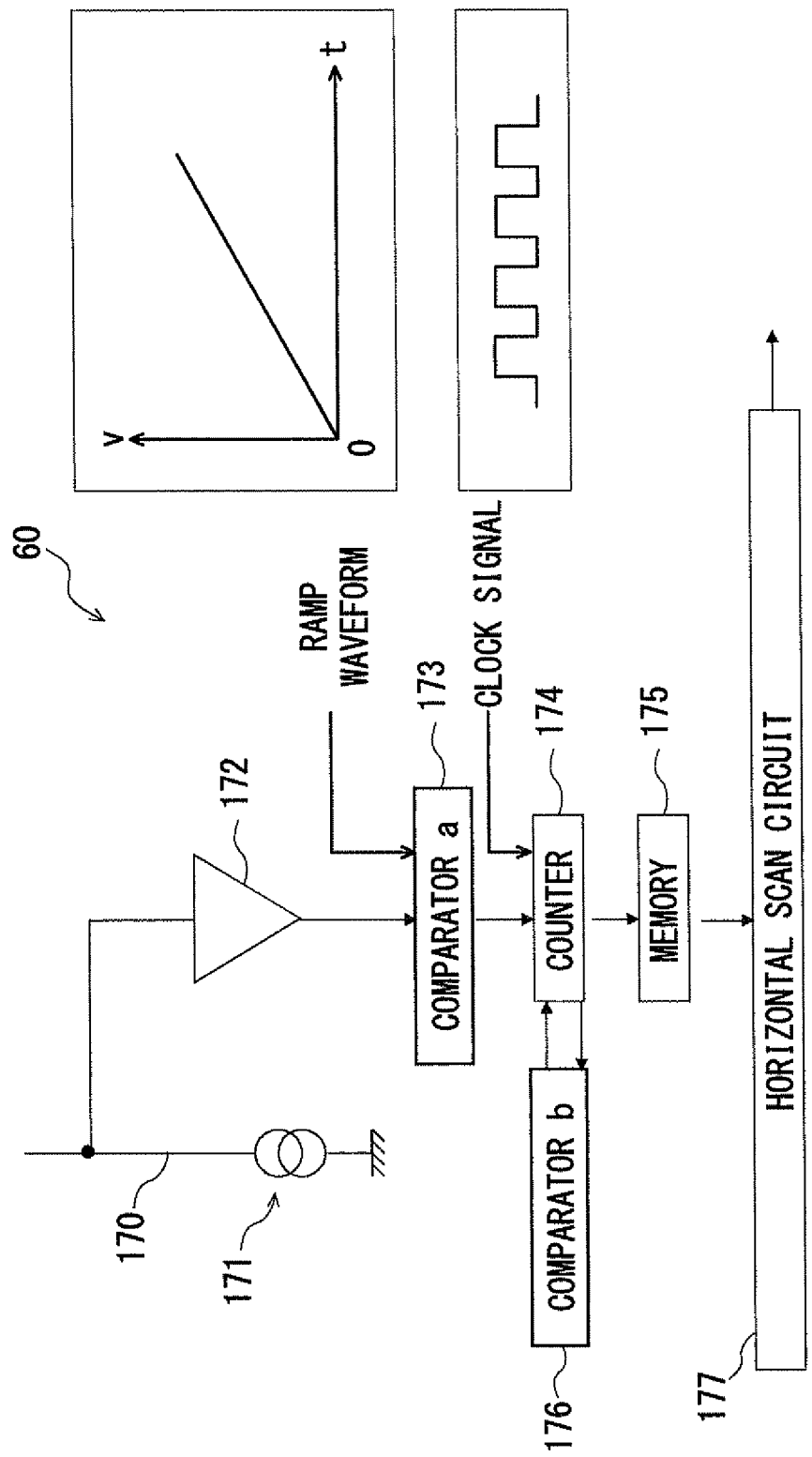
FIG. 7 shows a configuration of a column processing circuit according to the first exemplary embodiment.

FIG. 7 shows a configuration of the column processing circuit 60 according to the first exemplary embodiment. The column processing circuit 60 includes a load 171, a programmable amplifier 172, a comparator a 173, a counter 174, a memory 175, and a comparator b 176. The load 171 is a current source, and a voltage that occurs in this load 171 becomes an optical signal, i.e., a pixel signal. The programmable amplifier 172 amplifies the optical signal and outputs the amplified optical signal to the comparator a 173.

A ramp waveform is input to the comparator a 173. The ramp waveform is a waveform that is expressed in a coordinate system having a horizontal axis representing a time t and a vertical axis representing a voltage V input to the comparator a 173. Further, the voltage V is in proportion to the time t. The comparator a 173 outputs a signal to the counter 174 when its input voltage, i.e., the output voltage of the programmable amplifier 172, matches the ramp waveform. The counter 174 counts (i.e., measures) a time until the voltage value of the ramp waveform matches the output voltage of the programmable amplifier 172. In other words, the counter value is in proportion to the output voltage of the programmable amplifier 172. That is, the higher the output voltage of the programmable amplifier 172 is, the larger the counter value becomes. To put it differently, the counter value indicates a digital value corresponding to the output voltage of the programmable amplifier 172, i.e., the optical signal.

Specifically, the counter 174 is an up-down counter that counts a clock signal. Therefore, the counter 174 can count downwardly as well as upwardly. That is, the counter 174 counts, as an up-counter, the clock signal in a direction in which the counter value increases, i.e., in a positive direction, or counts, as a down-counter, the clock signal in a direction in which the counter value decreases, i.e., in a negative direction. When the counter 174 counts the clock signal as an up-counter, the counter value is a value that is in proportion to the output voltage of the programmable amplifier 172. On the other hand, when the counter 174 counts the clock signal as a down-counter, the counter value is a value that is in proportion to the output voltage of the programmable amplifier 172 but is reversed in terms of the polarity (i.e., positive and negative). For example, the counter 174 counts a reference voltage (i.e., counts the clock signal for a reference voltage) as a down-counter and counts the voltage value of the optical signal (i.e., counts the clock signal for the voltage value of the optical signal) as an up-counter, and thereby performs CDS (Correlated Double Sampling) processing. In this way, the comparator a 173 and the counter 174 form an ADC (Analog-to-Digital Converter) circuit.

The comparator b 176 controls the operation of the counter. The comparator b 176 compares the counter value of the counter 174 with a predetermined threshold and thereby determines the next operation of the counter 174. This predetermined threshold is explained later in detail. The counter value of the counter 174 after the CDS processing is accumulated (i.e., added up) in the memory 175. As shown in FIG. 5, singles are output from a plurality of column signal lines 170 to the horizontal scan circuit 177 and the horizontal scan circuit 177 successively outputs signals indicating processing results received from the plurality of column signal lines 170 to the subsequent circuit. In this way, the dynamic range is increased. This operation is described later. Note that when the increase in the dynamic range is unnecessary, the comparator b 176 may not be used.

(Operation)

Next, an operation of the circuit of the pixel unit 50 shown in FIG. 6 is explained. As an operating mode, both a global shutter operation and a rolling shutter operation are possible. In the first exemplary embodiment, the dynamic range can be increased for either the global shutter operation or the rolling shutter operation as explained below.

(Global Shutter Operation)

Figure 8:
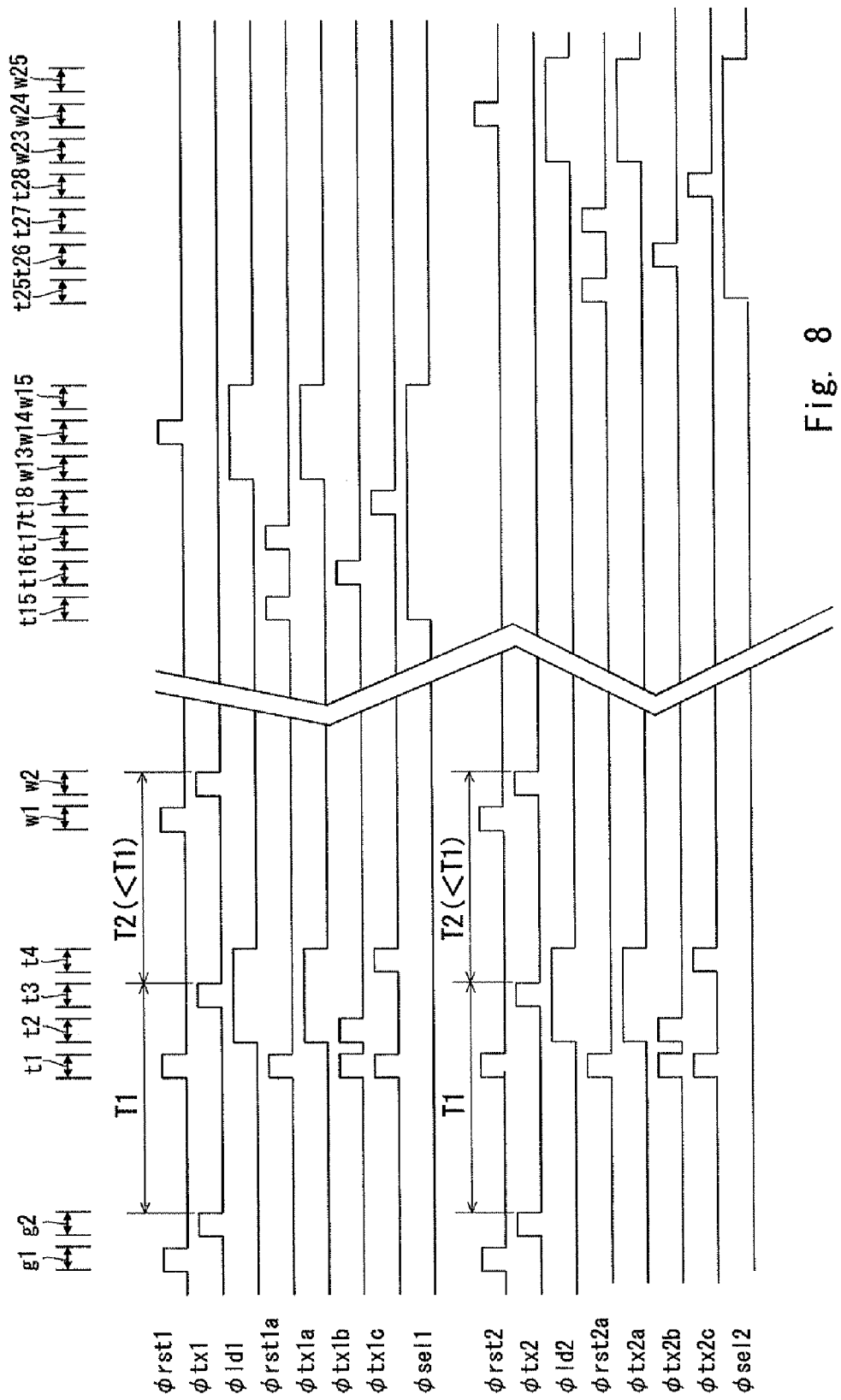
FIG. 8 shows a timing chart for a global shutter operation according to the first exemplary embodiment.

FIG. 8 shows a timing chart for a global shutter operation. The global shutter operation includes a step of simultaneously accumulating signals in capacitors in all the pixels and a step of successively reading the signals accumulated in the capacitors. The left side of the timing chart shown in FIG. 8 represents the accumulating step and the right side represents the reading step. The accumulating step is simultaneously performed for all the pixel units 50. In contrast to this, the reading step is successively performed for each pixel unit 50 by changing the pixel unit 50 electrically connected to the horizontal scan circuit 177 by using the selection transistors 148 and 168.

Firstly, at a time g1, all the pixel units 50 are simultaneously initialized (i.e., reset). Specifically, as the signals φrst1 and φrst2 become a high level, the floating diffusions 133 and 153, respectively, are initialized. Next, at a time g2, as the signals φtx1 and φtx2 become a high level, electrons accumulated in the photo-diodes 130 and 150 are transferred to the floating diffusions 133 and 153, respectively. As a result, no electron remains in the photo-diodes 130 and 150. After that, an exposure is performed so that light is incident on the photo-diodes 130 and 150 in this state. That is, an optoelectronic conversion is performed. This optoelectronic conversion starts at the end of the time g2 and continues until the next electron transfer has been finished in which electrons are transferred from the photo-diodes 130 and 150 to the floating diffusions 133 and 153, respectively, again, i.e., continues to the end of a time t3. This period from the end of the time g2 to the end of the time t3 is referred to as a first period T1.

Next, at a time t1, all the pixel units 50 are simultaneously initialized (i.e., reset). Specifically, as the signals φrst1 and φrst2 become a high level, the floating diffusions 133 and 153, respectively, are initialized. Further, at this point, as the signals φrst1a, φtx1b, and φtx1c become a high level, the capacitors 142 and 144 are initialized. Similarly, at this point, as the signals φrst2a, φtx2b, and φtx2c become a high level, the capacitors 162 and 164 are initialized. Note that the writing of signals into the capacitors 142 and 144 and the capacitors 162 and 162 are performed by voltages that are generated in the load transistors 135 and 155 by the amplifier transistors 134 and 154, respectively. Therefore, the initialization does not necessarily have to be performed. However, there is a possible problem that some amount of discrepancy could occur between when a signal is written into each capacitor in an originally high-voltage state in a voltage-decreasing direction and when a signal is written into each capacitor in an originally low-voltage state in a voltage-increasing direction. To avoid such a problem, the initialization is performed so that the voltage of each capacitor is adjusted to the high-voltage state.

As described above, the potentials in the initialized floating diffusions 133 and 153 are used as the reference potentials for the pixel units 50-1 and 50-2, respectively. At a time t2, these reference potentials are written into the capacitors 142 and 162. Specifically, as the signals φld1 and φld2 become a high level, a predetermined voltage is applied to the gates of the load transistors 135 and 155, respectively. In this way, the load transistors 135 and 155 operate as current sources. As a result, currents flow through the amplifier transistors 134 and 154, thus making the amplifier transistors 134 and 154 operate as source follower circuits. Further, at this point, as the signals φtx1a and φtx1b become a high level, the reference potential is recorded in the capacitor 142 through the connection section 136. Similarly, as the signals φtx2a and φtx2b become a high level, the reference potential is recorded in the capacitor 162 through the connection section 156.

At this point, the electric charges (electrons in the first exemplary embodiment), which were generated by the optoelectronic conversion performed in the first period T1, have been accumulated in the photo-diodes 130 and 150 as described above. At a time t3, as the signals φtx1b and φtx2b become a low level and the signals φtx1 and φtx2 become a high level, the electric charges are transferred from the photo-diodes 130 and 150 to the floating diffusions 133 and 153, respectively. As a result, the potentials of the floating diffusions 133 and 153 change by amounts corresponding to the transferred electric charges. For example, in the case where the electric charges are electrons, the potentials of the floating diffusions 133 and 153 decrease. These changed potentials become the potentials of the optical signals of the pixel units 50-1 and 50-2 in the first period T1.

Next, at a time t4, as the signals φtx1c and φtx2c become a high level, these potential of the floating diffusions 133 and 153 after the electric charge transfer are amplified by the amplifier transistors 134 and 154, respectively, and the amplified potentials are recorded in the capacitors 144 and 164, respectively. After the recording, the signals φld1, φtx1a, φtx1c, φld2, φtx2a and φtx2c become a low level and the recording of the optical signals in the first period T1 has been completed.

The next exposure, i.e., the next optoelectronic conversion has already started in the photo-diodes 130 and 150 since the time t3 in which the electric charges transfer from the photo-diodes 130 and 150 to the floating diffusions 133 and 153 has been finished and the signals φtx1 and φtx2 become a low level. After that, at a time w1, as the signals φrst1 and φrst2 become a high level, the floating diffusions 133 and 153, respectively, are initialized. After that, at a time w2, as the signals φtx1 and φtx2 become a high level, the electric charges are transferred from the photo-diodes 130 and 150 to the floating diffusions 133 and 153. Note that the period from the end of the time t3 to the end of the time w2 is referred to as a second period T2.

Note that the first exemplary embodiment is configured so that the first period T1 is longer than the second period T2. Note that when the times g1 and g2 are not provided, the first period T1 is, at the maximum, a time from the end of the time w2 to the end of the time t3 in which the signal φtx1 is brought into a high level and electrical charges are thereby transferred in the next frame. In this way, first optical signals obtained by the optoelectronic conversion performed in the first period T1, which is longer than the second period T2, are accumulated in the capacitors 144 and 164 in the time t4. Further, the reference potentials for the first optical signals are accumulated in the capacitors 142 and 162. Further, second optical signals obtained by the optoelectronic conversion performed in the second period T2, which is shorter than the first period T1, are accumulated in the floating diffusions 133 and 153 in the time w2. That is, the first optical signals are optical signals that are obtained by a long-time exposure and the second optical signals are optical signals that are obtained by a short-time exposure.

In this way, in all the pixel units 50, optical signals that are obtained by optoelectronic conversions performed in the first period T1 are recorded in the capacitors 142 and 144 and the capacitors 162 and 164, all of them are disposed in the substrate 2. Further, optical signals that are obtained by optoelectronic conversions performed in the second period T2 are recorded in the floating diffusions 133 and 153, both of which are disposed in the substrate 1. Next, the optical signals recorded in these components are read. Unlike the recording step (i.e., accumulating step), the reading step is not simultaneously performed in all the pixel units 50, but is successively performed for each sets of pixel units 50 connected to the column signal line 170, i.e., is successively performed on a row-by-row basis.

As shown in FIG. 7, the column processing circuits 60 each of which includes a load and an ADC circuit is connected to the column signal line 170. Each of these column processing circuits 60 processes a signal that is transferred through the column signal line 170. This process is explained with reference to the timing chart shown in FIG. 8 and a flowchart shown in FIG. 9.

Figure 9:
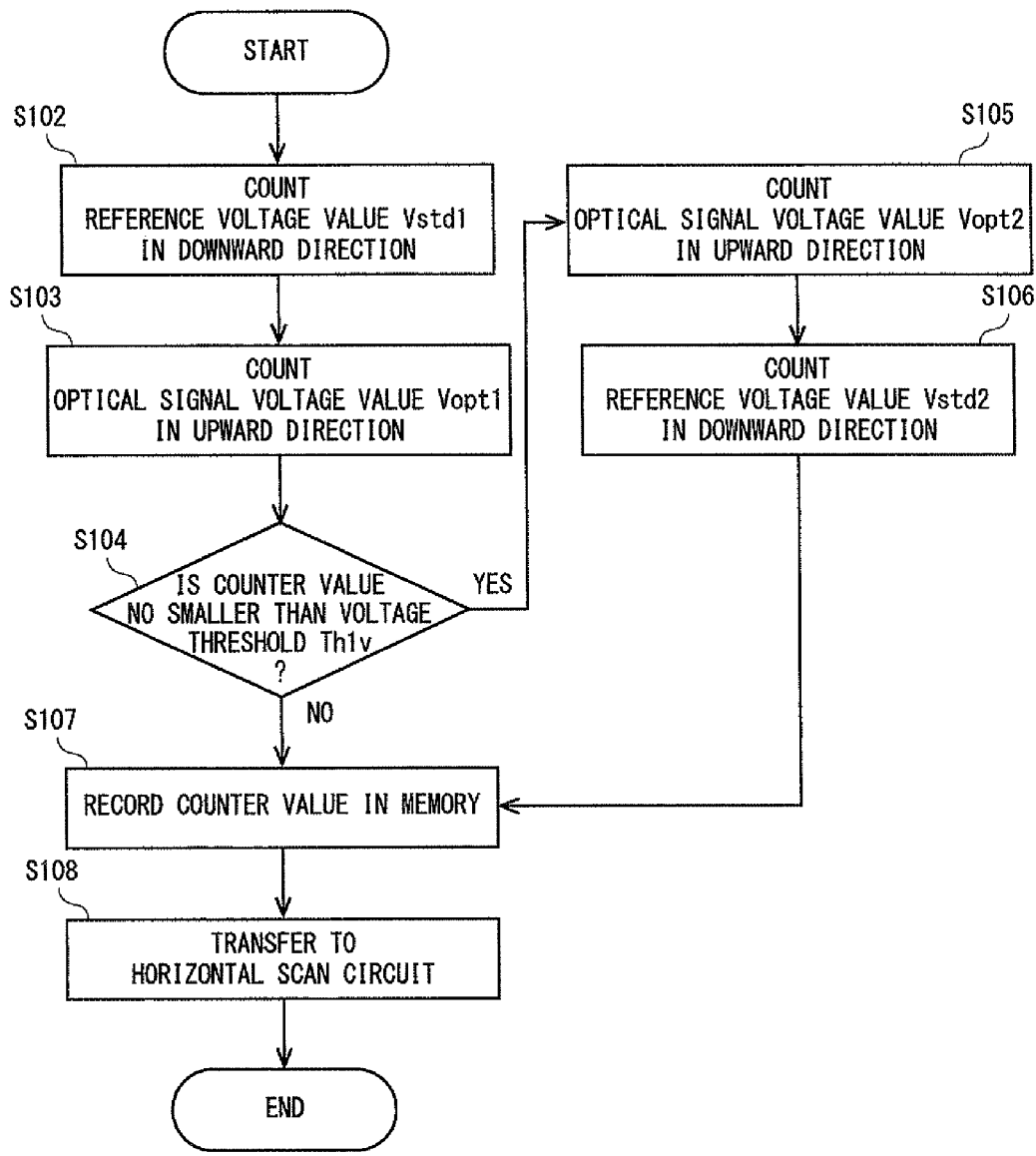
FIG. 9 shows a flowchart showing an operation in which a global shutter operation of the column processing circuit according to the first exemplary embodiment is performed.

FIG. 9 shows a flowchart showing an operation in which a global shutter operation is performed for the column processing circuit 60 according to the first exemplary embodiment. Firstly, at a time t15, as the signal φsel1 becomes a high level, the selection transistor 148 is turned on and the pixel unit 50-1 is thereby selected. At this point, as the signal φrst1a becomes a high level, the node 145 is initialized (i.e., reset). After that, at a time t16, as the signal φtx1b becomes a high level, the voltage level of the capacitor 142 is recorded in the node 145. Specifically, as the node 145 is initialized at the time t15, the reference voltage is recorded in the node 145. Note that the capacitance of the capacitor 142 is considerably larger that the stray capacitance of the node 145. Therefore, when the node 145, in which the reference voltage has been recorded, is charged by the capacitor 142 at the time t16, the voltage level of the node 145 becomes roughly equal to the voltage level of the capacitor 142.

Further, at this point, the potential of the node 145 is transferred to the column signal line 170 through the amplifier 147. In other words, the voltage level of the capacitor 142 is transferred to the column signal line 170. The voltage that occurs in the load 171 is amplified by the programmable amplifier 172 and the amplified voltage is transferred to the comparator a 173. In this state, a ramp waveform is input to the comparator a 173. Further, the counter 174 is brought into an initialized state in advance before the measurement.

When the ramp waveform is input to the comparator a 173, the counter 174 counts a reference voltage value Vstd1 (i.e., counts the clock signal or the like for a reference voltage value Vstd1), which is obtained by amplifying the reference potential accumulated in the capacitor 142 by the programmable amplifier 172, in a downward direction. After that, when the value output from the programmable amplifier 172 matches the value of the ramp waveform, the comparator a 173 outputs a pulse to the counter 174. As a result, the counter 174 stops the counting operation (S102). In this way, a counter value that corresponds to the reference voltage value Vstd1 but is reversed in terms of the polarity (i.e., positive and negative) is obtained.

Next, at a time t17, as the signal φrst1a becomes a high level, the node 145 is initialized again. Next, at a time t18, as the signal φtx1c becomes a high level, the voltage level of the capacitor 144, in which the optical signal has been recorded, is output to the column signal line 170 through the amplifier 147 as in the case of the process performed in the time t16.

Note that in the column processing circuit 60, when the ramp waveform is supplied to the comparator a 173, the counter 174 counts an optical signal voltage value Vopt1, which is obtained by amplifying the voltage level of the first optical signal accumulated in the capacitor 144 by the programmable amplifier 172, in an upward direction. After that, when the value output from the programmable amplifier 172 matches the value of the ramp waveform, the comparator a 173 outputs a pulse to the counter 174. As a result, the counter 174 stops the counting operation (S103). In this way, a counter value corresponding to the optical signal voltage value Vopt1 is obtained.

Note that the counter 174 counts the reference voltage value Vstd1 in the downward direction in the time t16, i.e., in the step S102, and counts the optical signal voltage value Vopt1 in the upward direction in the time t17, i.e., in the step S103. Therefore, the counter 174 counts a difference between the reference voltage value Vstd1 and the optical signal voltage value Vopt1. That is, it means that CDS processing has been performed. In this way, in the counter 174, a counter value corresponding to a value that is obtained by subtracting the reference voltage from the voltage value of the first optical signal, which is obtained by the optoelectronic conversion performed in the first period T1, is obtained.

Upon finishing the reading of the first optical signals obtained in the first period T1, the comparator b 176 compares the counter value obtained by the counter 174 with a predetermined voltage threshold Th1v. That is, the comparator b 176 determines whether or not the counter value obtained by the counter 174 is equal to or greater than the voltage threshold Th1v (S104). When the value of the first optical signals obtained in the first period T1 is equal to or greater than the voltage threshold Th1v (Yes at S104), the comparator b 176 instructs the counter 174 to perform an addition operation, i.e., a combining operation of the second optical signals obtained in the second period T2. On the other hand, when the value of the first optical signals obtained in the first period T1 is smaller than the voltage threshold Th1v (No at S104), the comparator b 176 instructs the counter 174 not to perform the addition operation, i.e., the combining operation of the second optical signals obtained in the second period T2.

Note that the voltage threshold Th1v is determined so that when the first optical signal obtained in the first period T1 is equal to or greater than the voltage threshold Th1v, noises in the first optical signal obtained in the first period T1 are equal to or larger than noised in the second optical signal obtained in the second period T2. The voltage threshold Th1v is explained hereinafter with reference to FIG. 10.

Figure 10:
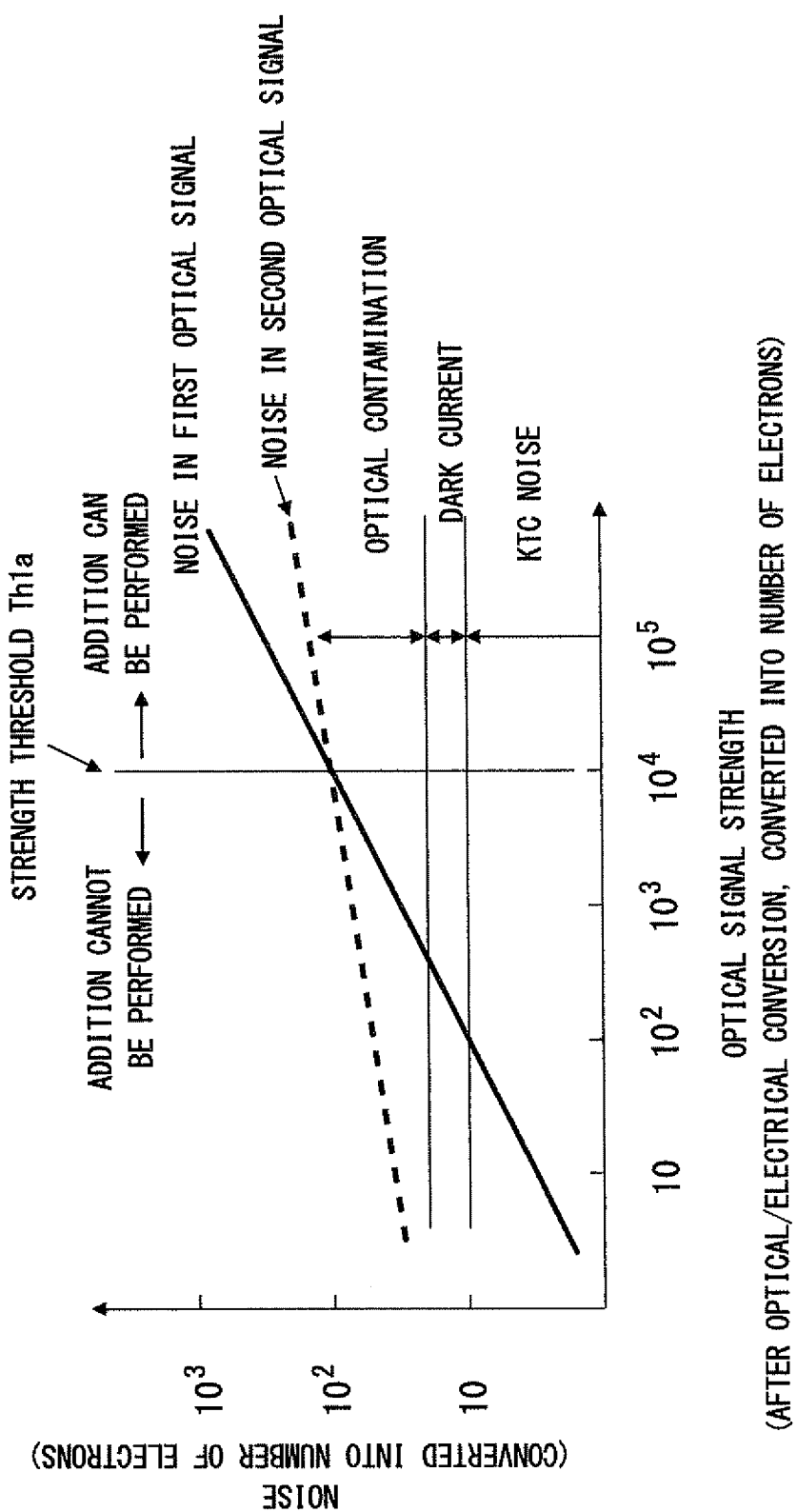
FIG. 10 shows a comparison between noises in a first optical signal and noises in a second optical signal.

FIG. 10 shows a comparison between noises in the first optical signal and noises in the second optical signal. In FIG. 10, the bold-type solid line represents noises in the first optical signal and the bold-type broken line represents noises in the second optical signal. In FIG. 10, the horizontal axis indicates strengths of the optical signals. Specifically, the horizontal axis indicates the numbers of electrons obtained by the optoelectronic conversions of the respective optical signals. Meanwhile, the vertical axis indicates noises in the optical signals. Specifically, the vertical axis indicates values that are obtained by converting the noises into the numbers of electrons.

The second optical signal obtained in the second period T2 has been recorded in the floating diffusion 133. Note that noises that occur in the floating diffusion 133 are very large. For example, an optical contamination that is caused by light that enters from the rear surface of the substrate 1 (the upper side in FIG. 4) and reaches the floating diffusion 133 occurs. Further, although the signal is reduced by a leak current, this optical contamination causes noises. The optical contamination increases as the strength of the optical signal increases. Alternatively, since the reset potential (i.e., initialization potential) at the time when the signal is recorded in the floating diffusion 133 is not stored, KTC noises, which are thermal noises, occur. Further, noises due to a dark current occur. As represented by the bold-type broken line in FIG. 10, the sum total of these noises is, for example, 50 to 100 as converted into the number of electrons. Therefore, when the second optical signal containing these noises is combined with the first optical signal in order to increase the dynamic range, the pixel signal becomes an optical signal containing large noises as a whole.

Meanwhile, the first optical signal obtained in the first period T1 has been recorded in the capacitor 144. Noises also occur in this first optical signal. Examples of the noises that occur in the first optical signal include noises due to a leak current of the capacitor and shot noises. In the first exemplary embodiment, a shot noise is examined as a noise that occurs in the first optical signal. The magnitude of the shot noise is equal to the square root of the optical signal. That is, as represented by the bold-type solid line in FIG. 10, the shot noise increases as the strength of the optical signal increases.

Further, as shown in FIG. 10, when the strength of the optical signal is small, the noise, i.e., the shot noise in the first optical signal is smaller than the noise in the second optical signal recorded in the floating diffusion 133. In this state, if the second optical signal is combined with the first optical signal, the noise in the second optical signal has its influence on the image quality. On the other hand, when the strength of the optical signal is large, the noise, i.e., the shot noise in the first optical signal is larger than the noise in the second optical signal recorded in the floating diffusion 133. In this state, even if the second optical signal is combined with the first optical signal, the influence of the noise in the second optical signal on the image quality is small. Therefore, when the noise in the first optical signal is equal to or larger than the noise in the second optical signal, the second optical signal may be combined with the first optical signal in order to increase the dynamic range.

Note that, as shown in FIG. 10, when the strength of the optical signal is equal to the strength threshold Th1a, the noise in the first optical signal is equal to the noise in the second optical signal. For example, if the noise in the floating diffusion 133 is 50 to 100 as expressed as the number of electrons, the strength threshold Th1a is 2,500 to 10,000 as expressed as the number of electrons. In FIG. 10, the strength threshold Th1a is $10^4$, i.e., 10,000. Note that although it is explained that the noises in the floating diffusion 133 may include KTC noises, dark currents, and optical contaminations in FIG. 10, the noises are not limited to these noises. Therefore, the strength threshold Th1a is determined by actually measuring light strengths and noises by using the solid-state image pickup device 100.

Therefore, when the strength of the first optical signal is equal to or larger than the strength threshold Th1a, the noises in the first optical signal are equal to or larger than the noises in the second optical signal, and hence the column processing circuit 60 may combine the second optical signal with the first optical signal. On the other hand, when the strength of the first optical signal is smaller than the strength threshold Th1a, the noises in the first optical signal are smaller than the noises in the second optical signal, and hence the column processing circuit 60 does not combine the second optical signal with the first optical signal.

Note that the voltage threshold Th1v is determined so as to correspond to the strength threshold Th1a. That is, the voltage threshold Th1v is determined so that when the strength of the optical signal accumulated in the pixel unit 50 is equal to the strength threshold Th1a, the counter value of the counter 174 is equal to the voltage threshold Th1v. Further, the larger the strength of the optical signal accumulated in the pixel unit 50 is, the large the counter value of the counter 174 becomes. Therefore, when the counter value is equal to or greater than the voltage threshold Th1v, the strength of the first optical signal is equal to or higher than the strength threshold Th1a. Similarly, when the counter value is smaller than the voltage threshold Th1v, the strength of the first optical signal is smaller than the strength threshold Th1a.

When the counter value is equal to or greater than the voltage threshold Th1v (Yes at S104), the comparator b 176 outputs a signal indicating that addition can be performed to the counter 174. As a result, the counter 174 performs an addition operation. This addition operation is performed by subsequently performing a counter operation in steps S105 and S106 by using the counter value obtained in the step S103 as explained below. At a time w13, as the signals φld1 and φtx1a become a high level, the second optical signal obtained in the second period T2, which has been accumulated in the floating diffusion 133, is transferred to the node 145 of the substrate 2 through the amplifier transistor 134 and the connection section 136. Since the selection transistor is in an on-state at this point, the amplifier 147 outputs the second optical signal transferred to the node 145 to the column signal line 170. That is, the potential at the node 145, i.e., the potential of the second optical signal is transferred to the column signal line 170 through the amplifier 147.

In other words, the voltage level of the second optical signal accumulated in the floating diffusion 133 is transferred to the column signal line 170. As described above, the voltage that occurs in the load 171 is amplified by the programmable amplifier 172 and the amplified voltage is transferred to the comparator a 173. At this point, a ramp waveform is input to the comparator a 173. When the ramp waveform is input to the comparator a 173, the counter 174 counts an optical signal voltage value Vopt2, which is obtained by amplifying the voltage level of the second optical signal accumulated in the floating diffusion 133 by the programmable amplifier 172, in an upward direction. Then, when the value output from the programmable amplifier 172 matches the value of the ramp waveform, the comparator a 173 outputs a pulse to the counter 174. As a result, the counter 174 stops the counting operation (S105). In this way, a counter value corresponding to the optical signal voltage value Vopt2 is obtained. Note that the counter value of the counter 174 at this point is actually in a state that has been obtained by further adding a counter value corresponding to the voltage value of the second optical signal to the counter value obtained in the step S103, i.e., the counter value corresponding to the value obtained by subtracting the reference voltage from the voltage value of the first optical signal.

Next, at a time w14, as the signal φrst1 becomes a high level, the floating diffusion 133 is initialized. That is, at this point, a potential corresponding to the reference potential is recorded in the floating diffusion 133. Next, at a time w15, this reference potential is transferred to the node 145 of the substrate 2 through the amplifier transistor 134 and the connection section 136. Since the selection transistor 148 is in an on-state at this point, the amplifier 147 outputs the reference potential transferred to the node 145 to the column signal line 170 as in the case of the time w13 and the step S105. That is, the potential at the node 145, i.e., the reference potential is transferred to the column signal line 170 through the amplifier 147.

In this state, the counter 174 of the column processing circuit 60 counts a reference voltage value Vstd2, which is obtained by amplifying the reference potential accumulated in the floating diffusion 133 by the programmable amplifier 172, in a downward direction. Then, when the value output from the programmable amplifier 172 matches the value of the ramp waveform, the comparator a 173 outputs a pulse to the counter 174. As a result, the counter 174 stops the counting operation (S106).

In this way, the CDS processing for the second optical signal obtained in the second period T2 has been finished. Further, the counter value of the counter 174 at this point corresponds to a value that is obtained by adding the second optical signal obtained in the second period T2 for which the CDS processing has been finished to the first optical signal obtained in the first period T1 for which the CDS processing has been finished.

On the other hand, when the counter value of the counter 174 at the end of the step S103 is smaller than the voltage threshold Th1v (No at S104), the addition operation is not performed. That is, the comparator b 176 outputs a signal indicating that addition cannot be performed to the counter 174. As a result, the counter 174 suspends its operation while the second optical signal is being output to the column signal line 170, i.e., during the time w13 to w15. Therefore, only the processing result of the first optical signal obtained in the first period T1 remains in the counter 174.

Next, the counter 174 transfers the counter value to the memory 175. The memory 175 accumulates the counter value in which the second optical signal is combined with the first optical signal (when the steps S105 and S106 have been performed) or the counter value of the first optical signal alone (when the steps S105 and S106 have not been performed) (S107). Finally, the horizontal scan circuit 177 reads the counter value accumulated in the memory 175 (S108). The horizontal scan circuit 177 transmits the counter value corresponding to the digital value of the pixel signals to the subsequent circuit on a column-by-column basis. In this way, the processing for one row of pixels is finished.

Next, in a time t25 to w25, processes similar to those in the above-described time t15 to w15 are performed for the next pixel unit 50-2. That is, a counter value, i.e., a digital value, corresponding to a pixel signal for the pixel unit 50-2 is read. When pixel signals for all the pixel units 50 connected to the column signal lines 170 are read in this way, the signal reading for one entire image has been finished.

Figure 11:
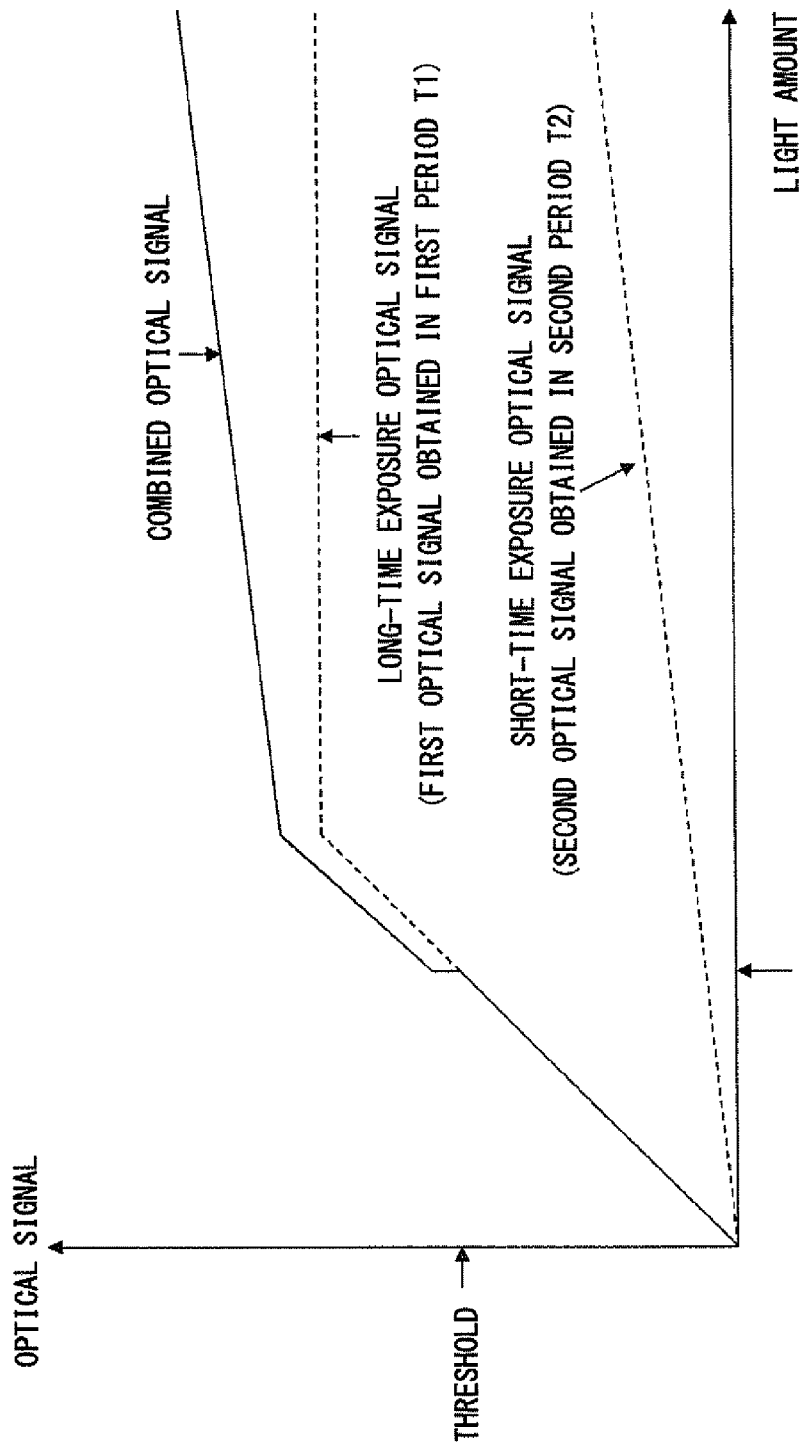
FIG. 11 is a graph showing a relation between amounts of light and optical signals in the first exemplary embodiment.

FIG. 11 is a graph showing a relation between amounts of light and optical signals in the first exemplary embodiment. In FIG. 11, the horizontal axis indicates the amount of light accumulated in the photo-diode 130 and the vertical axis indicates the voltage level of an optical signal read from the pixel unit 50. Further, the solid line represents an optical signal read from the pixel unit 50. Further, the broken line represents an optical signal obtained by a long-time (first period T1) exposure or an optical signal obtained by a short-time (second period T2) exposure. As shown in FIG. 11, the optical signal increases in proportion to the light amount. However, when the optical signal reaches the upper limit of the dynamic range, it saturates at the certain optical signal voltage level.

Meanwhile, in the first exemplary embodiment, as represented by the solid line in FIG. 11, the read optical signal contains only the first optical signal obtained in the first period T1 until the voltage level of the first optical signal obtained in the first period T1 reaches a predetermined threshold. Note that the "predetermined threshold" is a voltage level corresponding to the voltage threshold Th1v. Then, when the voltage level of the first optical signal obtained in the first period T1 reaches the predetermined threshold, an optical signal that is obtained by combing the second optical signal obtained in the second period T2 with the first optical signal is read. Therefore, even after the voltage level of the first optical signal obtained in the first period T1 saturates, the optical signal, which is obtained by combining the second optical signal with the first optical signal, continues to increase as the light amount increases. As a result, the dynamic range can be increased.

As described above, in the first exemplary embodiment, in the case of the global shutter operation, the second optical signals obtained in the second period T2, i.e., in the short-time exposure are accumulated in the floating diffusions 133 and 153. Note that the floating diffusions 133 and 153 are microscopic capacitances formed by a diffusion layer and are provided in existing solid-state image pickup devices. Therefore, the solid-state image pickup device 100 according to the first exemplary embodiment can increase the dynamic rage without increasing the number of capacitors.

Further, as described above, the optical signals are combined only when the first optical signal is equal to or greater than the predetermined threshold. Therefore, it is possible to prevent the increase of the noise effect that would otherwise be caused by combining the second optical signal with the first optical signal. That is, there is a possibility that if the floating diffusions are simply used to accumulate optical signals obtained by a short-time exposure, the image quality could deteriorates by combining optical signals accumulated in the floating diffusions because of the noises that occur in the floating diffusions. Therefore, the floating diffusions cannot be used as the accumulation part of the optical signal. In contrast to this, in the first exemplary embodiment, the optical signals accumulated in the floating diffusions are combined only when the noises in the optical signals accumulated in the floating diffusions have no influence on the image quality. Therefore, in the first exemplary embodiment, it is possible to prevent the increase of the noise effect even when the floating diffusions are used. That is, in the first exemplary embodiment, it is possible to increase the dynamic range while preventing the increase of the noise effect without increasing the number of capacitors.

(Rolling Shutter Operation)

Next, a rolling shutter operation is explained. Unlike the global shutter operation, all the pixels are not simultaneously processed in the rolling shutter operation. That is, pixels are processed on a row-by-row basis in the rolling shutter operation. In the global shutter operation, since all the pixels are simultaneously exposed, the time information is the same as each other for all the pixels. Therefore, an image having no distortion can be obtained in the global shutter operation.

Meanwhile, in general, the rolling shutter operation contains fewer noises than the global shutter operation does. In the global shutter operation, exposures are simultaneously performed for all the pixels and pixel signals of all the pixels are simultaneously accumulated. Then, the accumulated pixel signals are successively read on a row-by-row basis. Therefore, the lower the row of pixels is located, the longer time the pixel signals of that row are held for. The longer this holding time is, the more noises are superposed on the held signal electric charges and the more the image quality deteriorates. In contrast to this, in the case of the rolling shutter operation, exposures are successively performed and pixel signals are successively accumulated on a row-by-row basis. Then, the accumulated pixel signals are successively read on a row-by-row basis. Therefore, it is unnecessary to hold the pixel signals in the accumulation parts, or the holding time may be short. Consequently, noises can be reduced.

In the first exemplary embodiment, it is also possible to reduce the image signal holding time, compared to the above-described global shutter operation, by performing the rolling shutter operation. Therefore, it is possible to reduce the noises that are superposed on the held pixel signals. Accordingly, it is possible to use the rolling shutter operation and the global shutter operation according to the purpose. For example, when a subject for which an image distortion does not cause a substantial problem is shot, the rolling shutter operation may be used, whereas when a subject for which an image distortion should be avoided is shot, the global shutter operation may be used.

A method for increasing the dynamic range that is used when the rolling shutter operation is performed in the first exemplary embodiment is explained hereinafter. Note that even when the rolling shutter operation is performed, the same circuit configuration as that of the solid-state image pickup device 100 shown in FIGS. 5 to 7 can be used. That is, both the global shutter operation and the rolling shutter operation can be performed by using the same circuit configuration.

Figure 12:
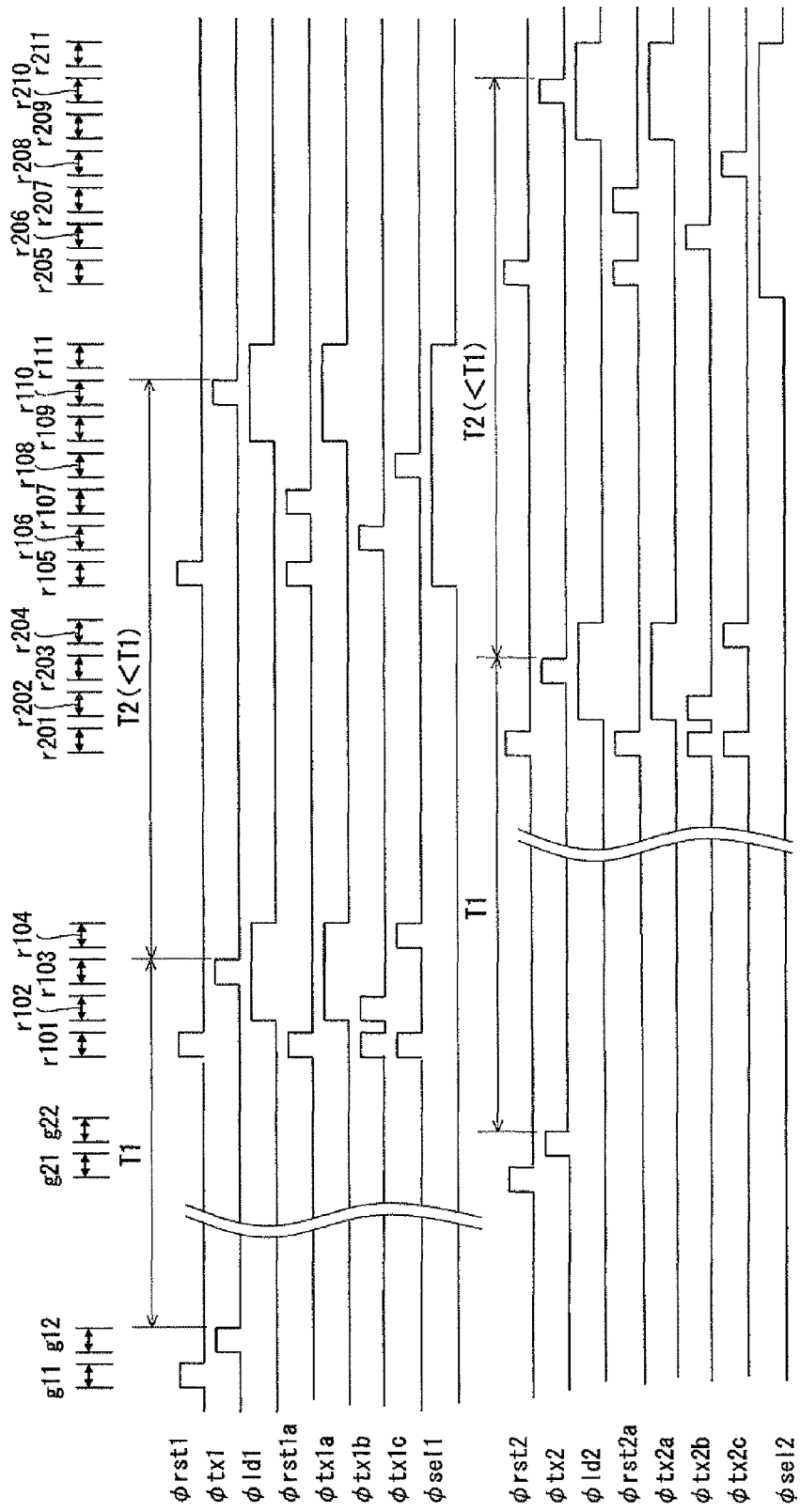
FIG. 12 shows a timing chart for a rolling shutter operation according to the first exemplary embodiment.
Figure 13:
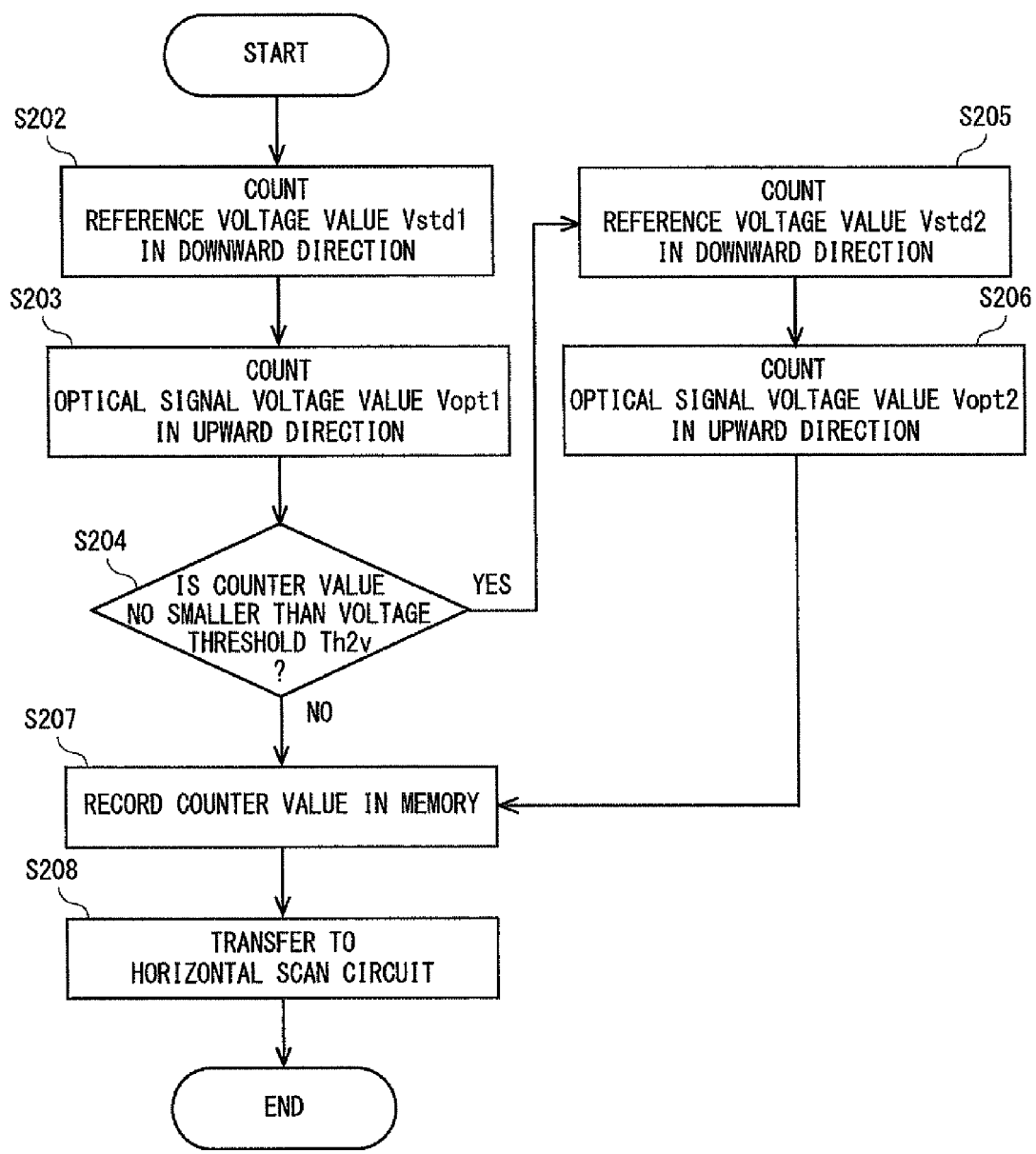
FIG. 13 shows a flowchart showing an operation in which a rolling shutter operation of the column processing circuit according to the first exemplary embodiment is performed.

FIG. 12 shows a timing chart for a rolling shutter operation according to the first exemplary embodiment. Further, FIG. 13 shows a flowchart showing an operation in which the rolling shutter operation of the column processing circuit 60 according to the first exemplary embodiment is performed. In the below-explained rolling shutter operation, processing for the pixel unit 50-1 is first performed and then processing for the pixel unit 50-2 is performed.

Firstly, at a time g11, as the signal φrst1 becomes a high level, the floating diffusion 133 is initialized (i.e., reset). Next, at a time g12, as the signal φtx1 becomes a high level, electrons accumulated in the photo-diode 130 are transferred to the floating diffusion 133. As a result, no electron remains in the photo-diode 130. After that, an exposure is performed so that light enters the photo-diode 130 in this state. That is, an optoelectronic conversion is performed. This optoelectronic conversion starts at the end of the time g12 and continues until the next electron transfer has been finished in which electrons are transferred from the photo-diode 130 to the floating diffusion 133 again, i.e., continues to the end of a time r103. This period from the end of the time g12 to the end of the time r103 is the first period T1.

Further, at a time g21, as the signal φrst2 becomes a high level, the floating diffusion 153 is initialized. Next, at a time g22, as the signal φtx2 becomes a high level, electrons accumulated in the photo-diode 150 are transferred to the floating diffusion 153. As a result, no electron remains in the photo-diode 150. After that, an exposure is performed so that light enters the photo-diode 150 in this state. That is, an optoelectronic conversion is performed. This optoelectronic conversion starts at the end of the time g22 and continues until the next electron transfer has been finished in which electrons are transferred from the photo-diode 150 to the floating diffusion 153 again, i.e., continues to the end of a time r203. This period from the end of the time g22 to the end of the time r203 is the first period T1.

Next, in a time r101 to r104, processing for the pixel unit 50-1 is performed. Specifically, at a time r101, as the signal φrst1 becomes a high level, the floating diffusion 133 is initialized. Further, at this point, as the signals φrst1a, φtx1b, and φtx1c become a high level, the capacitors 142 and 144 are initialized. Next, in a time r102 to r104, the signals φld1 and φtx1a become a high level. Further, at the time t102, as the signal φtx1b becomes a high level, the potential of the initialized floating diffusion 133, i.e., the reference potential is amplified by the amplifier transistor 134 and the amplified reference potential is recorded in the capacitor 142.

At this point, the electric charge, which has been generated by the optoelectronic conversion performed in the first period T1, is accumulated in the photo-diode 130 as described above. At a time r103, as the signal φtx1b becomes a low level and the signal φtx1 becomes a high level, the electric charge (electrons in this example) of the photo-diode 130 is transferred to the floating diffusion 133 and hence the potential of the floating diffusion 133 changes. Next, at a time r104, as the signal φtx1 becomes a low level and the signal φtx1c becomes a high level, the potential of the floating diffusion 133, to which the transfer of the electric charge has been completed, is amplified by the amplifier transistor 134 and the amplified potential is recorded in the capacitor 144. In this way, the first optical signal obtained in the first period T1 is recorded in the capacitors 142 and 144, i.e., in a first optical signal accumulation part.

Further, in the photo-diode 130, the accumulation of the second optical signal in the second period T2 has already started since a time r104 after the electric charge transfer performed in the time r103. The second period T2 is a period from the end of the time r103 to the end of the next transfer of electrons from the photo-diode 130 to the floating diffusion 133, i.e., to the end of a time r110. Note that even in the rolling shutter operation, the first period T1 is longer than the second period T2 as in the case of the above-described global shutter operation.

Further, in a time r201 to r204, the first optical signal obtained in the first period T1 for the pixel unit 50-2 is recorded in a first optical signal accumulation part (specifically, the capacitors 162 and 164) in a manner similar to that in the time r101 to r104. For the pixel unit 50-2, the accumulation of the second optical signal in the second period T2 has also already started in the photo-diode 150 since a time r204 after the electric charge transfer performed in the time r203.

After a predetermined time has elapsed, signal reading is performed in the pixel unit 50-1. At a time r105, as the signal φsel1 becomes a high level, the pixel unit 50-1 is connected to the column signal line 170. At this point, as the signals φrst1 and φrst1a become a high level, the floating diffusion 133 and the node 145 are initialized. As a result, a potential corresponding to the reference potential is recorded in the floating diffusion 133. Next, at a time r106, as the signal φtxb1 becomes a high level, the potential of the capacitor 142 is transferred to the column signal line 170 through the amplifier 147.

In the column processing circuit 60 connected to the column signal line 170, in a step S202 in FIG. 13, the counter 174 counts a reference voltage value Vstd1, which is obtained by amplifying the reference potential accumulated in the capacitor 142 by the programmable amplifier 172, in a downward direction as in the case of the step S102. Next, at a time r107, as the signal φrst1a becomes a high level, the node 145 is initialized. Next, at a time r108, as the signal φtx1c becomes a high level, the potential of the capacitor 144, i.e., the potential of the first optical signal is transferred to the column signal line 170 through the amplifier 147. At this time point, in a step S203 in FIG. 13, the counter 174 counts an optical signal voltage value Vopt1, which is obtained by amplifying the voltage level of the first optical signal accumulated in the capacitor 144 by the programmable amplifier 172, in an upward direction as in the case of the step S103. In this way, a counter value for which CDS processing has been performed for the difference between the reference voltage value Vstd1 accumulated in the capacitor 142 and the optical signal voltage value Vopt1 accumulated in the capacitor 144 and which corresponds to the first optical signal obtained in the first period T1 remains in the counter.

Next, in a step S204 in FIG. 13, the comparator b 176 determines whether or not the counter value is equal to or greater than a voltage threshold Th2v, which is a predetermined threshold. It is important to mention that the voltage threshold Th2v is different from the voltage threshold Th1v, which is the threshold for the global shutter operation. In the case of the global shutter operation, the second optical signals obtained in the second period T2 are stored in the floating diffusions 133 and 153. In this case, since KTC noises and noises caused by leak currents and the like are large, the voltage threshold Th1v is used as the threshold. In contrast to this, in the case of the rolling shutter operation, the second optical signals obtained in the second period T2 can be stored in the photo-diodes 130 and 150. Note that the noises for the electrons accumulated in the photo-diodes 130 and 150 are much smaller than the noises in the floating diffusions 133 and 153. Therefore, the voltage threshold Th2v can be made smaller than the voltage threshold Th1v. Regarding noise values, while the noise value in the global shutter operation is 50 to 100 as expressed as the number of electrons, the noise value in the rolling shutter operation is 5 to 10 as expressed as the number of electrons. That is, the noise value in the rolling shutter operation is smaller than that in the global shutter operation by one digit. As a result, the strength threshold Th2A corresponding to the voltage threshold Th2v is 25 to 100 as converted into the number of electrons and smaller than the strength threshold Th1a in the global shutter operation (which is about 10,000) by two digits.

When the counter value is compared with the voltage threshold Th2v and the first optical signal obtained in the first period T1 for which the CDS processing is performed, i.e., the counter value for which the CDS processing is performed is larger than the voltage threshold Th2v as described above (Yes at S204), the counter 174 performs an addition operation of the second optical signal obtained in the second period T2 when the counter 174 reads the second optical signal. This addition operation is performed by subsequently performing a counter operation in steps S205 and S206 by using the counter value obtained in the step S203 as explained below.

At a time r109, as the signals φld1 and φtx1a become a high level, the potential of the floating diffusion 133, which was initialized in the time r105 and in which the electric charge has been accumulated, is transferred to the node 145 through the amplifier transistor 134. That is, the reference potential accumulated in the floating diffusion 133 is transferred to the node 145. Since the selection transistor 148 is in an on-state at this point, the reference potential transferred to the node 145 is output to the column signal line 170 through the amplifier 147 as in the case of the time w15 and the step S106. The counter 174 of the column processing circuit 60 counts a reference voltage value Vstd2, which is obtained by amplifying the reference potential accumulated in the floating diffusion 133 by the programmable amplifier 172, in a downward direction (S205).

Next, at a time r110, as the signal φtx1 becomes a high level, electrons accumulated in the photo-diode 130 are transferred to the floating diffusion 133. In other words, the second optical signal accumulated in the photo-diode 130 in the second period T2 is transferred to the floating diffusion 133. As a result, the potential of the floating diffusion 133 changes. Next, at a time r111, as the signal φtx1 becomes a low level, the electron transfer has been finished. Then, the potential of the floating diffusion 133 is transferred to the node 145 through the amplifier transistor 134. Further, the potential at the node 145 is transferred to the column signal line 170 through the amplifier 147. Then, similarly to the time w13 and the step S105, the counter 174 of the column processing circuit 60 counts an optical signal voltage value Vopt2, which is obtained by amplifying the voltage level of the second optical signal accumulated in the photo-diode 130, in an upward direction (S206). In this way, the CDS processing is performed for the second optical signal obtained in the second period T2. Further, the counter value of the counter 174 at this point corresponds to a value that is obtained by adding the second optical signal obtained in the second period T2 for which the CDS processing has been finished to the first optical signal obtained in the first period T1 for which the CDS processing has been finished.

Note that the order of the upward counting and the downward counting in the processes in the steps S205 and S206 is reversed from the order of the upward counting and the downward counting in the processes in the steps S105 and S106. That is, in the case of the global shutter operation shown in FIG. 9, the optical signal voltage value Vopt2 is first counted in an upward direction in the step S105 and then the reference voltage value Vstd2 is counted in a downward direction in the step S106. In contrast to this, in the case of the rolling shutter operation shown in FIG. 13, the reference voltage value Vstd2 is first counted in a downward direction in the step S205 and then the optical signal voltage value Vopt2 is counted in an upward direction in the step S206. This is because since the accumulation place of the second optical signal obtained in the second period T2 in the global shutter operation is different from that in the rolling shutter operation, the reading method for the second optical signal in the global shutter operation is different from that in the rolling shutter operation. Specifically, in the case of the global shutter operation, the second optical signal is accumulated in the floating diffusion 133 and the reference potential is accumulated in the floating diffusion 133 after the second optical signal is read out from the floating diffusion 133. In contrast to this, in the case of the rolling shutter operation, the second optical signal is accumulated in the photo-diode 130 and the reference potential is accumulated in the floating diffusion 133 before the second optical signal is read out from the photo-diode 130. Note that as shown in FIG. 6, the floating diffusion 133 is located closer to the column signal line 170 than the photo-diode 130 is. Therefore, in the case of the global shutter operation, the second optical signal is read before the reference potential is read. Further, in the cased of the rolling shutter operation, the reference potential is read before the second optical signal is read.

On the other hand, when the counter value of the counter 174 at the end of the step S203 is smaller than the voltage threshold Th2v (No at S204), the addition operation is not performed. That is, the comparator b 176 outputs a signal indicating that addition cannot be performed to the counter 174. As a result, the counter 174 suspends its operation while the second optical signal is being output to the column signal line 170, i.e., during the time r109 to r111. Therefore, only the processing result of the first optical signal obtained in the first period T1 remains in the counter 174.

Next, the counter 174 transfers the counter value to the memory 175. The memory 175 accumulates the counter value in which the second optical signal is combined with the first optical signal (when the steps S205 and S206 have been performed) or the counter value of the first optical signal alone (when the steps S205 and S206 have not been performed) (S207). Finally, the horizontal scan circuit 177 reads the counter value accumulated in the memory 175 and transmits the counter value corresponding to the digital value of the pixel signal to the subsequent circuit on a column-by-column basis (S208).

Next, processes similar to those in the above-described time r205 to r211 are performed for the next pixel unit 50-2 in a time r105 to r111. That is, a counter value, i.e., a digital value, corresponding to a pixel signal for the pixel unit 50-2 is read. When pixel signals for all the pixel units 50 connected to the column signal lines 170 are read in this way, the signal reading for one entire image has been finished.

As described above, even in the rolling shutter operation, it is possible to increase the dynamic range while preventing the increase of the noises as in the case of the global shutter operation. That is, in the first exemplary embodiment, in the case of the rolling shutter operation, optical signals obtained in short-time exposures are accumulated in the photo-diodes 130 and 150. Therefore, the solid-state image pickup device 100 according to the first exemplary embodiment can increase the dynamic rage without increasing the number of capacitors. Further, since optical signals obtained in short-time exposures are accumulated in the photo-diodes 130 and 150 rather than in the floating diffusions 133 and 153, it is possible to prevent (or reduce) the noise effect on the image quality. Further, as described above, as for the threshold, which is used to combine optical signals obtained in short-time exposures with optical signals obtained in long-time exposures, the voltage threshold Th2v, which is the threshold in the rolling shutter operation, can be made smaller than the voltage threshold Th1v, which is the threshold in the global shutter operation. Therefore, in the case of the rolling shutter operation, even when an optical signal obtained in the long-time exposure is small, an optical signal obtained in the short-time exposure can be combined with the optical signal obtained in the long-time exposure.

Modified Example

Note that the present invention is not limited to the above-described exemplary embodiments, and various modifications can be made without departing from the spirit of the present invention. For example, in each of the above-described flowcharts, at least one step can be omitted as appropriate. For example, the step S107 in FIG. 9 can be omitted. Further, the order of the steps in each of the above-described flowcharts can be changed as appropriate. For example, the order of the steps S102 and S103 in FIG. 9 can be reversed. These changes can be also made in FIG. 13.

Further, in the above-described exemplary embodiments, it is assumed that when the first optical signal obtained in the first period T1 is equal to or greater than the predetermined threshold, the noises in the first optical signal obtained in the first period T1 are equal to or larger than the noises in the second optical signal obtained in the second period T2. Further, the first exemplary embodiment is configured so that when the first optical signal is equal to or larger than the predetermined threshold, the second optical signal is combined with the first optical signal. However, the exemplary embodiments according to the present invention are not limited to such configurations. In the exemplary embodiment, the noises in the first optical signal may be compared with the noises in the second optical signal by actually measuring the noises in each of the first and second optical signals. However, actually measuring noises in optical signals is much more difficult than simply comparing optical signals with a threshold. Therefore, by configuring the device so that when the first optical signal is equal to or larger than the predetermined threshold, the second optical signal is combined with the first optical signal, the dynamic range can be increased more easily.

Further, although the CDS processing is performed by using a comparator and a counter in the first exemplary embodiment, the present invention is not limited to such configurations. The CDS processing may be performed by using a clamping circuit using a capacitor or may be performed by using a differential amplifier. Further, the AD conversion is also not limited to the method according to the above-described first exemplary embodiment. A pipeline-type AD converter may be used for the AD conversion.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A solid-state image pickup device comprising:
   an optoelectronic conversion unit that performs an optoelectronic conversion;
   a first optical signal accumulation unit that accumulates an optical signal obtained by the optoelectronic conversion by the optoelectronic conversion unit;
   a second optical signal accumulation unit that accumulates an optical signal obtained by the optoelectronic conversion by the optoelectronic conversion unit; and
   a combining unit that combines the optical signal accumulated in the second optical signal accumulation unit with the optical signal accumulated in the first optical signal accumulation unit, wherein
   the first optical signal accumulation unit accumulates a first optical signal obtained by the optoelectronic conversion by the optoelectronic conversion unit in a first period,
   the second optical signal accumulation unit accumulates a second optical signal obtained by the optoelectronic conversion by the optoelectronic conversion unit in a second period, the second period being shorter than the first period, and the combining unit combines the second optical signal with the first optical signal when a noise in the first optical signal is equal to or larger than a noise in the second optical signal, and the first optical signal accumulation unit and the second optical signal accumulation unit accumulate the optical signal as an analog type signal at a capacitor.

2. The solid-state image pickup device according to claim 1, further comprising:

a first substrate; and a second substrate opposed to the first substrate, the second substrate being electrically connected to the first substrate, wherein the optoelectronic conversion unit and the second optical signal accumulation unit are disposed in the first substrate, and the first optical signal accumulation unit is disposed in the second substrate.

3. The solid-state image pickup device according to claim 2, wherein at least one of a floating diffusion and the optoelectronic conversion unit is used as the second optical signal accumulation unit.

4. The solid-state image pickup device according to claim 1, wherein the combining unit combines the second optical signal with the first optical signal when a value of the first optical signal is equal to or greater than a predetermined threshold.

5. The solid-state image pickup device according to claim 4, wherein the solid-state image pickup device performs a global shutter operation and a rolling shutter operation, and the threshold that is used when the rolling shutter operation is performed is smaller than the threshold that is used when the global shutter operation is performed.

6. The solid-state image pickup device according to claim 1, wherein the solid-state image pickup device performs a global shutter operation and a rolling shutter operation, when the global shutter operation is performed, the combining unit first counts a value corresponding to the second optical signal in an upward direction and then counts a value corresponding to a reference voltage in a downward direction, and when the rolling shutter operation is performed, the combining unit first counts the value corresponding to the reference voltage in the downward direction and then counts the value corresponding to the second optical signal in the upward direction.

7. The solid-state image pickup device according to claim 6, wherein when the global shutter operation is performed, the second optical signal is accumulated in a floating diffusion used as the second optical signal accumulation unit and the reference voltage is accumulated in the floating diffusion after the second optical signal is read out from the floating diffusion, and when the rolling shutter operation is performed, the second optical signal is accumulated in the optoelectronic conversion unit used as the second optical signal accumulation unit and the reference voltage is accumulated in the floating diffusion before the second optical signal is read out from the optoelectronic conversion unit.

* * * * *